(12) United States Patent
Shin

(10) Patent No.: US 10,224,506 B2
(45) Date of Patent: Mar. 5, 2019

(54) DISPLAY DEVICE WITH BLOCK MEMBERS HAVING DIFFERENT HEIGHTS

(71) Applicant: Samsung Display Co., Ltd., Yongin-si, Gyeonggi-do (KR)

(72) Inventor: Sung-Young Shin, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/890,971

(22) Filed: Feb. 7, 2018

(65) Prior Publication Data

US 2018/0183004 A1    Jun. 28, 2018

Related U.S. Application Data

(63) Continuation of application No. 15/476,661, filed on Mar. 31, 2017, now Pat. No. 9,966,566, which is a
(Continued)

(30) Foreign Application Priority Data

Nov. 17, 2015  (KR) .................. 10-2015-0161200

(51) Int. Cl.
*H01L 51/52* (2006.01)
*H01L 27/32* (2006.01)
(Continued)

(52) U.S. Cl.
CPC ........ *H01L 51/5253* (2013.01); *G02F 1/1368* (2013.01); *G02F 1/13394* (2013.01);
(Continued)

(58) Field of Classification Search
CPC ............. H01L 51/5253; H01L 27/3246; H01L 27/3258; H01L 27/3276; G02F 1/133345; G02F 1/13394; G02F 1/1368
See application file for complete search history.

(56) References Cited

U.S. PATENT DOCUMENTS 8,536,574 B2    9/2013 Kim et al.
2014/0117336 A1*   5/2014 Kim .................... H01L 51/5246
                                                          257/40
(Continued)

FOREIGN PATENT DOCUMENTS

KR    10-2015-0024471 A    3/2015

*Primary Examiner* — Peniel M Gumedzoe
(74) *Attorney, Agent, or Firm* — Lewis Roca Rothgerber Christie LLP

(57) ABSTRACT

A display device and a method of manufacturing the display device are disclosed. In one aspect, the display device includes a substrate including a display region and a peripheral region. A first block member is in the peripheral region and surrounding display structures, the first block member having a first height. A second block member is spaced apart from the first block member in a first direction extending from the display region to the peripheral region, the second block member surrounding the first block member, the second block member having a second height that is greater than the first height. A first encapsulation layer is over the display structures, the first block member, and the second block member. A second encapsulation layer is over the first encapsulation layer, the second encapsulation layer overlapping at least a portion of the first block member in the depth dimension of the display device.

22 Claims, 30 Drawing Sheets

Related U.S. Application Data continuation of application No. 15/204,928, filed on Jul. 7, 2016, now Pat. No. 9,634,287.

(51) Int. Cl.
*G02F 1/1339* (2006.01)
*G02F 1/1368* (2006.01)
*G02F 1/1333* (2006.01)
*G02F 1/1362* (2006.01)

(52) U.S. Cl.
CPC .. *G02F 1/133345* (2013.01); *G02F 1/133377* (2013.01); *H01L 27/3246* (2013.01); *H01L 27/3258* (2013.01); *H01L 27/3276* (2013.01); *G02F 2001/13396* (2013.01); *G02F 2001/133337* (2013.01); *G02F 2001/133357* (2013.01); *G02F 2001/136236* (2013.01); *G02F 2201/50* (2013.01); *H01L 51/5237* (2013.01); *H01L 2227/323* (2013.01); *H01L 2251/5338* (2013.01); *H01L 2251/558* (2013.01)

(56) References Cited

U.S. PATENT DOCUMENTS

| | | | |
|---|---|---|---|
| 2014/0132148 A1* | 5/2014 | Jang | H01L 51/5246 313/504 |
| 2015/0380685 A1* | 12/2015 | Lee | H01L 51/5243 257/40 |

* cited by examiner

US 10,224,506 B2

DISPLAY DEVICE WITH BLOCK MEMBERS HAVING DIFFERENT HEIGHTS

CROSS-REFERENCE TO RELATED APPLICATION(S)

This application is a continuation of U.S. patent application Ser. No. 15/476,661, filed Mar. 31, 2017, which is a continuation of U.S. patent application Ser. No. 15/204,928, filed Jul. 7, 2016, now U.S. Pat. No. 9,634,287, issued Apr. 25, 2017, which claims priority under 35 USC § 119 to Korean Patent Application No. 10-2015-0161200, filed on Nov. 17, 2015 in the Korean Intellectual Property Office, the disclosures of which are incorporated by reference herein in their entireties.

BACKGROUND

Field

The described technology generally relates to display devices and a method of manufacturing display devices.

Description of the Related Technology

A flat panel display (FPD) is widely used for image and video display in portable electronic devices because the FPD is lightweight and thin compared to a cathode-ray tube (CRT) displays. Typical examples of FPD technologies are a liquid crystal display (LCD) and an organic light-emitting diode (OLED) display.

Recently, a flexible OLED display that can bend or fold by including lower and upper substrates made of flexible materials like plastic has been developed. For example, the lower substrate can be formed of a flexible substrate, and the upper substrate can have a thin film encapsulation structure. To block permeation of water or moisture, the thin film encapsulation structure can include at least one inorganic layer and at least one organic layer, and the inorganic and organic layers can be alternatively stacked on the lower substrate. In forming the thin film encapsulation structure, at least one block member can be disposed in an outside (e.g., outskirts, suburb, etc.) of the lower substrate to block leakage of the organic layer. The block member can also support a mask that is used in a process forming a display structure. However, as the mask is placed on the block member, an upper surface of the block member can be scratched (e.g., a crack can result). The thin film encapsulation can thus be defective because of the uneven surface, and the flexible display device can have a reduced useful lifetime.

SUMMARY OF CERTAIN INVENTIVE ASPECTS

One inventive aspect relates to a display device including block members.

Another aspect is a method of manufacturing a display device including block members.

Another aspect is a display device that includes a substrate, display structures, a first block member, a second block member, a first encapsulation layer, a second encapsulation layer, and a third encapsulation layer. The substrate includes a display region and a peripheral region surrounding the display region. The display structures are disposed in the display region of the substrate. The first block member having a first height is disposed in the peripheral region on the substrate, and surrounds the display structures. The second block member having a second height that is greater than the first height is spaced apart from the first block member in a direction that is from the display region into the peripheral region, and surrounds the first block member. The first encapsulation layer including inorganic materials is disposed on the display structures, the first block member, and the second block member. The second encapsulation layer including organic materials is disposed on the first encapsulation layer, and overlaps at least a portion of the first block member. The third encapsulation layer including the inorganic materials is disposed on the first and second encapsulation layers.

In example embodiments, the first and second block members are simultaneously formed using a half tone slit mask.

In example embodiments, an upper surface of the first block member is irregular.

In example embodiments, an upper surface of the first block member has a concave and convex structure.

In example embodiments, an upper surface of the first block member has a plurality of recesses.

In example embodiments, a height ratio of the first height and the second height consists essentially of a height ratio of about 0.6:1 to about 0.8:1. The first height can be a height from an upper surface of the substrate to an upper surface of the first block member, and the second height can be a height from an upper surface of the substrate to an upper surface of the second block member.

In example embodiments, the first encapsulation layer and the third encapsulation layer contact each other on the second block member.

In example embodiments, the first block member is not in contact with the second block member, and the first and second block members are parallel to each other.

In example embodiments, the display device further includes a third block member in the peripheral region on the substrate.

In example embodiments, the third block member is spaced apart from the first block member in a direction that is from the peripheral region into the display region, and the third block member has the first height.

In example embodiments, the first, second, and third block members are simultaneously formed using a half tone mask, and an upper surface of each of the first to third block members is irregular.

In example embodiments, the third block member is disposed between the first block member and the second block member, and the first, second, and third block members are spaced apart from each other. The third block member has the first height.

In example embodiments, the first, second, and third block members are simultaneously formed using a half tone mask, and an upper surface of each of the first, second, and third block members is irregular.

In example embodiments, the third block member is disposed between the first block member and the second block member, and the first, second, and third block members are spaced apart from each other. The third block member has the second height.

In example embodiments, the first, second, and third block members are simultaneously formed using a half tone slit mask, and an upper surface of each of the first to third block members is irregular.

In example embodiments, the display device further includes semiconductor elements between the substrate and the display structures. Each of the semiconductor elements can include an active layer on the substrate, a gate electrode on the active layer, and source and drain electrodes on the gate electrode.

In example embodiments, the display device further includes a gate insulation layer, an insulating interlayer, a planarization layer, and a pixel defining layer. The gate insulation layer is disposed on the substrate, and can cover the active layer. The insulating interlayer is disposed on the gate insulation layer, and can cover the gate electrode. The planarization layer is disposed on the insulating interlayer, and can cover the source and drain electrodes. The pixel defining layer can be disposed on the planarization layer.

In example embodiments, the second block member includes a lower block pattern on the insulating interlayer and an upper block pattern on the lower block pattern.

In example embodiments, the upper block pattern covers the lower block pattern, and has the second height. A portion of a lower surface of the upper block pattern can be in contact with the substrate, and the upper block pattern does not expose the lower block pattern.

In example embodiments, the lower block pattern and the planarization layer are simultaneously formed using the same materials.

In example embodiments, the first height is greater than a height that is from an upper surface of the substrate into an upper surface of the pixel defining layer.

In example embodiments, each of the display structures includes a lower electrode, a light emitting layer, and an upper electrode. The lower electrode can be interposed between the planarization layer and the pixel defining layer, and can be partially exposed by the pixel defining layer. The light emitting layer can be disposed on the lower electrode. The upper electrode can be on the light emitting layer.

In example embodiments, the display device further includes a first power supply voltage line and a second power supply voltage line. The first power supply voltage line can be disposed in the peripheral region on the insulating interlayer, and can be spaced apart from the first block member in a direction from the peripheral region into the display region. The second power supply voltage line can be spaced apart from the first power supply voltage line in a direction from the peripheral region into the display region. The first block member can be disposed on the first power supply voltage line.

In example embodiments, the upper electrode extends in a direction from the display region into peripheral region, and is in contact with the first power supply voltage line in the peripheral region.

In example embodiments, a low power supply voltage is applied to the first power supply voltage line, and a high power supply voltage is applied to the second power supply voltage line.

In example embodiments, the first and second power supply voltage lines and the source and drain electrodes are simultaneously formed using the same materials.

Another aspect is a method of manufacturing a display device. A substrate including a display region and a peripheral region surrounding the display region is provided. Display structures are formed in the display region of the substrate. A first block member is formed as a first height in the peripheral region on the substrate, and surrounds the display structures. A second block member spaced apart from the first block member in a direction that is from the display region into the peripheral region is formed, and surrounds the first block member. The second block member has a second height that is greater than the first height. A first encapsulation layer including inorganic materials is formed on the display structures, the first block member, and the second block member. A second encapsulation layer including organic materials is formed on the first encapsulation layer, and overlaps at least a portion of the first block member. A third encapsulation layer including the inorganic materials is formed on the first and second encapsulation layers.

In example embodiments, forming the first and second block members includes forming a preliminary planarization layer on the substrate, forming a planarization layer in the display region and a lower block pattern in the peripheral region by partially removing the preliminary planarization layer, forming a preliminary pixel defining layer on the lower block pattern and the planarization layer, and forming a pixel defining layer in the display region and a first block member and an upper block pattern in the peripheral region by partially removing the preliminary pixel defining layer. The upper block pattern can surround the first block member and locating on the lower block pattern.

In example embodiments, the preliminary pixel defining layer is partially removed using a half tone slit mask, and the half tone slit mask includes an opening region, a light shielding region, a slit region, and a transflective region. The preliminary pixel defining layer can be completely removed in the opening region, and can be not removed in the light shielding region. The preliminary pixel defining layer can be partially removed in the transflective and slit regions.

In example embodiments, the pixel defining layer is formed in the transflective region of the half tone slit mask, and the first block member is formed in the slit region of the half tone slit mask. The lower block pattern and the upper block pattern can be formed in the light shielding region of the half tone slit mask.

In example embodiments, the lower and upper block patterns are the second block member.

In example embodiments, an upper surface of the first block member is irregular.

In example embodiments, an upper surface of the first block member has a concave and convex structure.

In example embodiments, an upper surface of the first block member has a plurality of recesses.

In example embodiments, prior to forming the display structures, the method further includes forming semiconductor elements on the substrate.

In example embodiments, forming the semiconductor elements includes forming active layers on the substrate, forming a gate insulation layer covering the active layers on the substrate, forming gate electrodes on the gate insulation layer, forming an insulating interlayer covering the gate electrode on the gate insulation layer, and forming source and drain electrodes and first and second power supply voltage lines on the insulating interlayer.

In example embodiments, forming the display structures includes forming a planarization layer covering the source and drain electrodes and the first and second power supply voltage lines on the insulating interlayer, forming lower electrodes on the planarization layer, forming a pixel defining layer exposing a portion of each of the lower electrodes on the planarization layer, forming light emitting layers on the lower electrodes, and forming an upper electrode on the light emitting layers and the pixel defining layer.

In example embodiments, a height ratio of the first height and the second height consists essentially of a height ratio of about 0.6:1 to about 0.8:1. The first height can be a height from an upper surface of the substrate to an upper surface of the first block member, and the second height can be a height from an upper surface of the substrate to an upper surface of the second block member.

In example embodiments, forming the first and second block members includes forming a preliminary pixel defining layer and forming a pixel defining layer and first and second block members by partially removing the preliminary pixel defining layer. The second block member can surround the first block member.

In example embodiments, the preliminary pixel defining layer is partially removed using a half tone slit mask, and the half tone slit mask includes an opening region, a light shielding region, a slit region, and a transflective region. The preliminary pixel defining layer can be completely removed in the opening region, and is not removed in the light shielding region. The preliminary pixel defining layer can be partially removed in the transflective and slit regions.

In example embodiments, the pixel defining layer is formed in the transflective region of the half tone slit mask, and the first block member is formed in the slit region of the half tone slit mask. The second block member can be formed in the light shielding region of the half tone slit mask.

Another aspect is a display device, comprising: a substrate including a display region and a peripheral region surrounding the display region; a plurality of display structures in the display region; a first block member in the peripheral region and surrounding the display structures, the first block member having a first height; a second block member spaced apart from the first block member in a first direction extending from the display region to the peripheral region, the second block member surrounding the first block member, the second block member having a second height that is greater than the first height; a first encapsulation layer over the display structures, the first block member, and the second block member, wherein the first encapsulation layer is formed of an inorganic material; a second encapsulation layer over the first encapsulation layer, the second encapsulation layer overlapping at least a portion of the first block member in the depth dimension of the display device, the second encapsulation layer formed of an organic material; and a third encapsulation layer over the first and second encapsulation layers, the third encapsulation layer formed of the inorganic material.

In the above display device, the first and second block members are formed of the same material.

In the above display device, an upper surface of the first block member is uneven.

In the above display device, an upper surface of the first block member has a concave portion and a convex portion.

In the above display device, an upper surface of the first block member has a plurality of recesses.

In the above display device, a ratio of the first height to the second height is in the range of about 0.6:1 to about 0.8:1, wherein the first height is defined from an upper surface of the substrate to an upper surface of the first block member, and wherein the second height is defined from the upper surface of the substrate to an upper surface of the second block member.

In the above display device, the first and third encapsulation layers directly contact each other over the second block member.

In the above display device, the first block member does not directly contact the second block member, wherein the first and second block members are parallel to each other.

The above display device further comprises a third block member in the peripheral region on the substrate.

In the above display device, the third block member is spaced apart from the first block member in a second direction extending from the peripheral region to the display region, wherein the third block member has the first height.

In the above display device, the first, second, and third block members are formed of the same material, wherein an upper surface of each of the first to third block members is uneven.

In the above display device, the third block member is disposed between the first and second block members, wherein the first, second, and third block members are spaced apart from each other, and wherein the third block member has the first height.

In the above display device, the first, second, and third block members are formed of the same material, wherein an upper surface of each of the first, second, and third block members is uneven.

In the above display device, the third block member is disposed between the first and second block members, wherein the first, second, and third block members are spaced apart from each other, and wherein the third block member has the second height.

In the above display device, the first, second, and third members are formed of the same material, wherein an upper surface of each of the first to third block members is uneven.

The above display device further comprises a plurality of semiconductor elements interposed between the substrate and the display structures, wherein each of the semiconductor elements includes: an active layer over the substrate; a gate electrode over the active layer; and source and drain electrodes over the gate electrode.

The above display device further comprises: a gate insulation layer over the active layer; an insulating interlayer over the gate electrode; a planarization layer over the source and drain electrodes; and a pixel defining layer over the planarization layer.

In the above display device, the second block member includes: a lower block pattern over the insulating interlayer; and an upper block pattern over the lower block pattern.

In the above display device, the upper block pattern covers the lower block pattern and has the second height, wherein a portion of a lower surface of the upper block pattern directly contacts the substrate, and wherein the upper block pattern does not expose the lower block pattern.

In the above display device, the lower block pattern and the planarization layer are formed of the same material.

In the above display device, the first height is greater than a height defined from an upper surface of the substrate to an upper surface of the pixel defining layer.

In the above display device, each of the display structures includes: a lower electrode interposed between the planarization layer and the pixel defining layer, the lower electrode having a plurality of side portions directly contacting the pixel defining layer; a light emitting layer over the lower electrode; and an upper electrode over the light emitting layer.

The above display device further comprising a first power supply voltage line in the peripheral region and over the insulating interlayer, the first power supply voltage line being spaced apart from the first block member in a second direction extending from the peripheral region to the display region; and a second power supply voltage line spaced apart from the first power supply voltage line in the second direction, wherein the first block member is disposed over the first power supply voltage line.

In the above display device, the upper electrode extends in the first direction and directly contacts the first power supply voltage line in the peripheral region.

In the above display device, the first power supply voltage line is configured to receive a first power supply voltage, wherein the second power supply voltage line is configured to receive a second power supply voltage that is greater than the first power supply voltage.

In the above display device, the first and second power supply voltage lines and the source and drain electrodes are formed of the same material.

Another aspect is a method of manufacturing display device, comprising: providing a substrate including a display region and a peripheral region surrounding the display region; forming a plurality of display structures in the display region; forming a first block member in the peripheral region and surrounding the display structures, the first block member having a first height; forming a second block member spaced apart from the first block member in a first direction extending from the display region to the peripheral region, the second block member surrounding the first block member and having a second height that is greater than the first height; forming a first encapsulation layer over the display structures, the first block member, and the second block member, wherein the first encapsulation layer is formed of an inorganic material; forming a second encapsulation layer over the first encapsulation layer, the second encapsulation layer overlapping at least a portion of the first block member in the depth dimension of the display device, wherein the second encapsulation layer is formed of an organic material; and forming a third encapsulation layer over the first and second encapsulation layers, the third encapsulation layer formed of the inorganic material.

In the above method, forming the first and second block members includes: forming a preliminary planarization layer over the substrate; partially removing the preliminary planarization layer so as to form a planarization layer in the display region and a lower block pattern in the peripheral region; forming a preliminary pixel defining layer over the lower block pattern and the planarization layer; and partially removing the preliminary pixel defining layer so as to form a pixel defining layer in the display region and a first block member and an upper block pattern in the peripheral region, the upper block pattern surrounding the first block member and located on the lower block pattern.

In the above method, the preliminary pixel defining layer is partially removed using a half tone slit mask, wherein the half tone slit mask includes an opening region, a light shielding region, a slit region, and a transflective region, wherein the preliminary pixel defining layer is completely removed in the opening region and is not removed in the light shielding region, and wherein the preliminary pixel defining layer is partially removed in the transflective and slit regions.

In the above method, the pixel defining layer is formed in the transflective region of the half tone slit mask, wherein the first block member is formed in the slit region of the half tone slit mask, and wherein the lower block pattern and the upper block pattern are formed in the light shielding region of the half tone slit mask.

In the above method, the lower and upper block patterns form the second block member.

In the above method, an upper surface of the first block member is uneven.

In the above method, an upper surface of the first block member has a concave portion and a convex portion.

In the above method, an upper surface of the first block member has a plurality of recesses.

The above method further comprises forming semiconductor elements on the substrate before forming the display structures.

In the above method, forming the semiconductor elements includes: forming active layers over the substrate; forming a gate insulation layer over the active layers; forming gate electrodes over the gate insulation layer; forming an insulating interlayer over the gate electrode and the gate insulation layer; and forming source and drain electrodes and first and second power supply voltage lines over the insulating interlayer.

In the above method, forming the display structures includes: forming a planarization layer over the source and drain electrodes and the first and second power supply voltage lines; forming lower electrodes over the planarization layer; forming a pixel defining layer that exposes a portion of each of the lower electrodes; forming light emitting layers over the lower electrodes; and forming an upper electrode over the light emitting layers and the pixel defining layer.

In the above method, a ratio of the first height to the second height is in the range of about 0.6:1 to about 0.8:1, wherein the first height is defined from an upper surface of the substrate to an upper surface of the first block member, and wherein the second height is defined from the upper surface of the substrate to an upper surface of the second block member.

In the above method, forming the first and second block members includes: forming a preliminary pixel defining layer; and partially removing the preliminary pixel defining layer so as to form a pixel defining layer and first and second block members, the second block member surrounding the first block member.

In the above method, the preliminary pixel defining layer is partially removed using a half tone slit mask, wherein the half tone slit mask includes an opening region, a light shielding region, a slit region, and a transflective region, wherein the preliminary pixel defining layer is completely removed in the opening region and is not removed in the light shielding region, and wherein the preliminary pixel defining layer is partially removed in the transflective and slit regions.

In the above method, the pixel defining layer is formed in the transflective region of the half tone slit mask, wherein the first block member is formed in the slit region of the half tone slit mask, and wherein the second block member is formed in the light shielding region of the half tone slit mask.

According to at least one of the disclosed embodiments, the display device includes a first block member having a first height and a second block member having a second height that is higher than the first height, and an upper surface of the first block member is not in contact with a mask. Accordingly, a defect of a thin film encapsulation structure can be prevented.

DETAILED DESCRIPTION OF CERTAIN INVENTIVE EMBODIMENTS

Hereinafter, embodiments will be explained in detail with reference to the accompanying drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1:
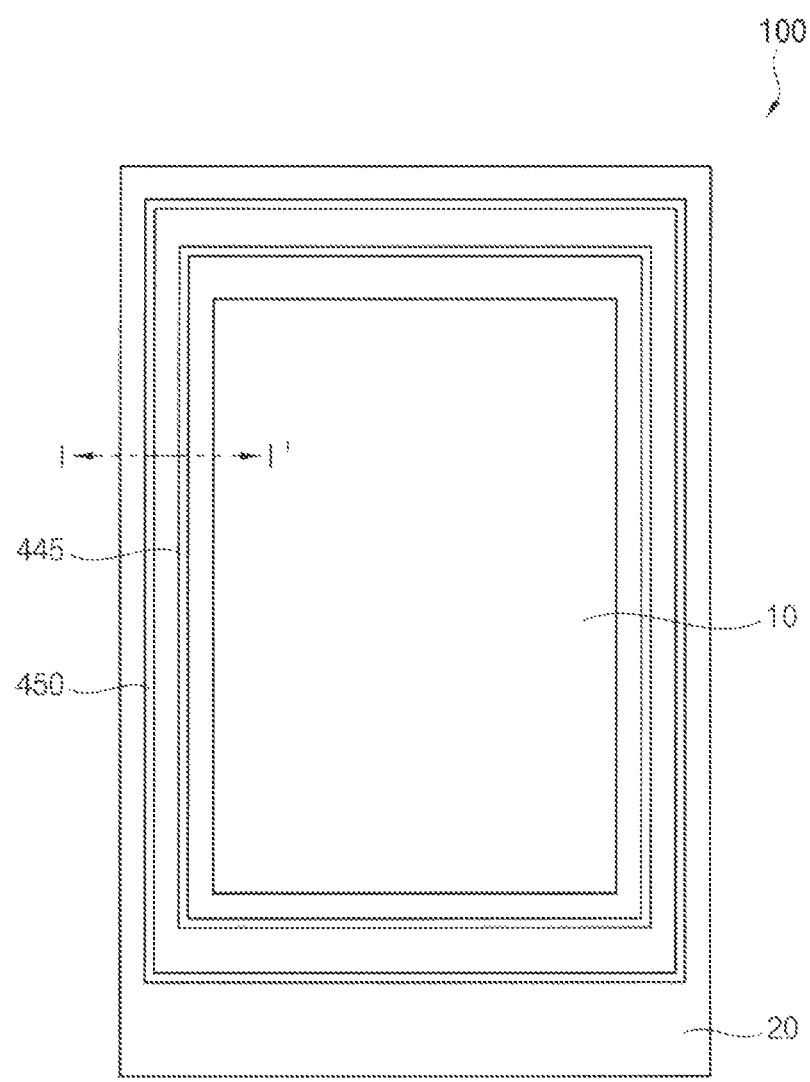
FIG. 1 is a planar view illustrating a display device in accordance with example embodiments.

FIG. 1 is a planar view illustrating a display device in accordance with example embodiments.

Referring to FIG. 1, a display device 100 includes a display region 10 and a peripheral region 20.

Display structures can be disposed in the display region 10. A display image can be displayed in the display region 10 through the display structure (e.g., organic light-emitting diode, liquid crystal, etc.). Conductive lines (e.g., scan lines, data lines, power supply voltage lines, etc.) can be disposed in the peripheral region 20. Here, the conductive lines can be electrically connected to the display structures.

In example embodiments, a first block member 445 and a second block member 450 are disposed in the peripheral region 20. The first block member 445 can have a first height, and can surround the display structures. The second block member 450 can have a second height that is greater than the first height, and can surround the first block member 445. For example, the first block member 445 is not in contact with the second block member 450, and they are parallel to each other. The first and second block members 445 and 450 can prevent leakage of organic layer included in a thin film encapsulation (TFE) structure that will be described below. In addition, the display device 100 can include a flexible substrate. In this way, as the display device 100 includes the flexible substrate and the TFE structure, the display device 100 can serve as a flexible display device.

The display and peripheral regions 10 and 20 illustrated in FIG. 1 can have a planar shape of a substantially square shape (or a substantially rectangular shape), but the shape is not limited thereto. For example, the display and peripheral regions 10 and 20 can have a planar shape of a substantially triangle shape, a substantially diamond shape, a substantially polygonal shape, a substantially circular shape, a substantially track shape, or a substantially elliptical shape.

Figure 2:
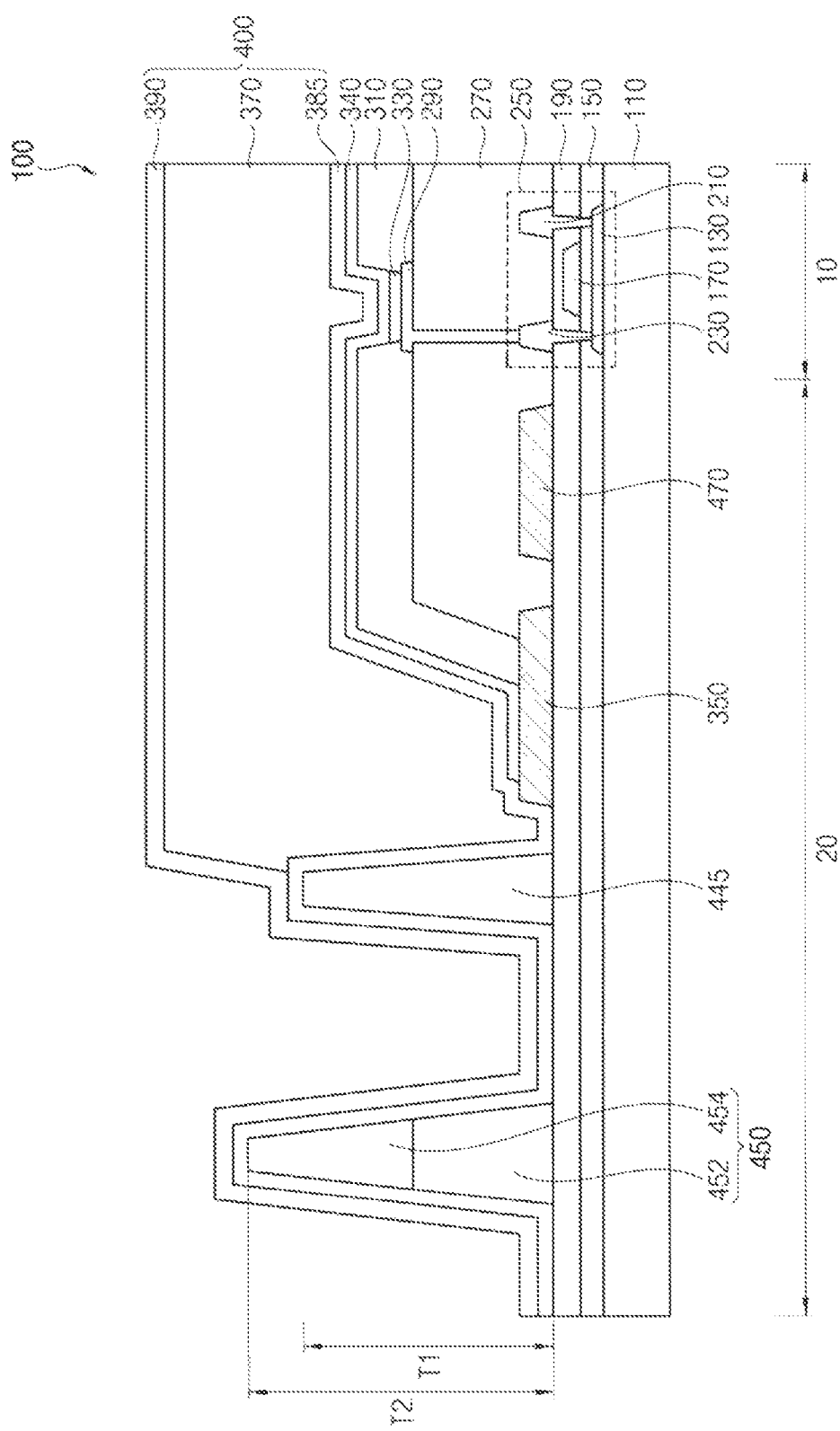
FIG. 2 is a cross-sectional view taken along a line I-I' of FIG. 1.
Figure 3:
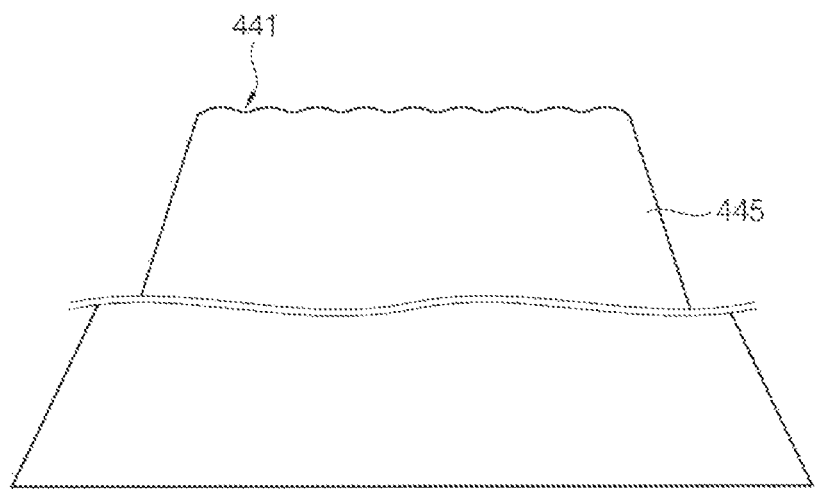
FIG. 3 is a cross-sectional view illustrating an example of a first block member included in a display device of FIG. 2.
Figure 4:
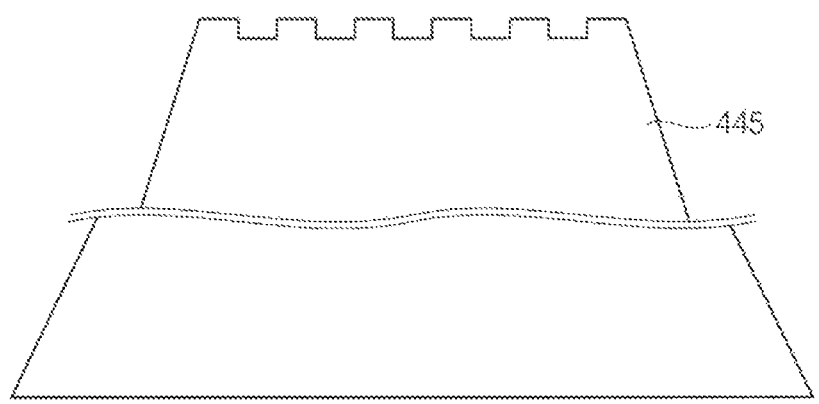
FIG. 4 is a cross-sectional view illustrating another example of a first block member included in a display device of FIG. 2.
Figure 5:
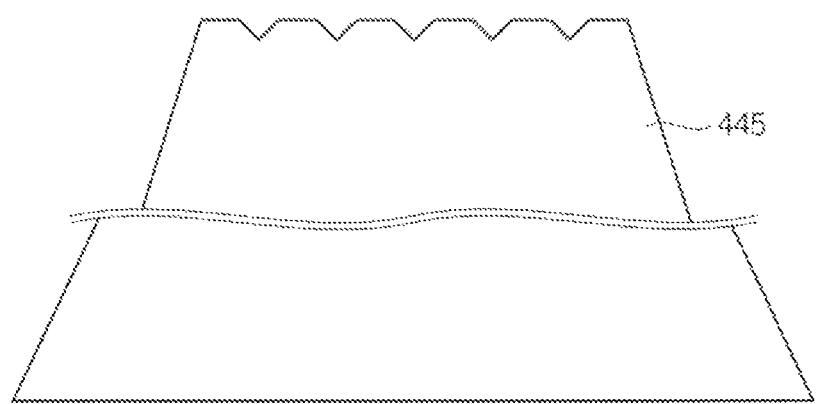
FIG. 5 is a cross-sectional view illustrating still another example of a first block member included in a display device of FIG. 2.

FIG. 2 is a cross-sectional view taken along a line I-I' of FIG. 1. FIG. 3 is a cross-sectional view illustrating an example of a first block member included in a display device of FIG. 2. FIG. 4 is a cross-sectional view illustrating another example of a first block member included in a display device of FIG. 2. FIG. 5 is a cross-sectional view illustrating still another example of a first block member included in a display device of FIG. 2.

Referring to FIGS. 2 through 5, a display device 100 includes a substrate 110, a semiconductor element 250, a gate insulation layer 150, an insulating interlayer 190, a planarization layer 270, a first power supply voltage line 350, a second power supply voltage line 470, a display structure, a pixel defining layer 310, first block member 445, a second block member 450, a thin film encapsulation structure 400, etc. Here, the display structure can include a lower electrode 290, a light emitting layer 330, and an upper electrode 340, and the semiconductor element 250 can include an active layer 130, a gate electrode 170, a source electrode 210, and a drain electrode 230. The thin film encapsulation structure 400 can include a first encapsulation layer 385, a second encapsulation layer 370, and a third encapsulation layer 390. In addition, the second block member 450 can include a lower block pattern 452 and an upper block pattern 454.

As described above, the display device 100 can include a display region 10 and a peripheral region 20. For example, a display image is displayed in the display region 10, and the first power supply voltage line 350, the second power supply voltage line 470, the first block member 445, and the second block member 450 are disposed in the peripheral region 20. As the display device 100 includes a flexible substrate 110 and the thin film encapsulation structure 400, the display device 100 can serve as a flexible display device.

The substrate 110 can be provided. The substrate 110 can be formed of transparent materials. The substrate 110 can be formed of a flexible transparent material such as a flexible transparent resin substrate (e.g., a polyimide substrate). For example, the polyimide substrate includes a first polyimide layer, a first barrier film layer, a second polyimide layer, a second barrier film layer, etc. Since the polyimide substrate is relatively thin and flexible, the polyimide substrate can be disposed on a rigid glass substrate to help support the formation of an upper structure (e.g., the semiconductor element 250, the display structure, etc.). That is, the substrate 110 can have a structure in which the first polyimide layer, the first barrier film layer, the second polyimide layer, and the second barrier film layer are stacked on the rigid glass substrate. In a manufacturing the display device 100, after an insulation layer (e.g., a buffer layer) is provided on the second barrier film layer of the polyimide substrate, the upper structure can be disposed on the insulation layer. After the upper structure is formed on the insulation layer, the rigid glass substrate on which the polyimide substrate is disposed can be removed. It can be difficult to directly form the upper structure on the polyimide substrate because the polyimide substrate is relatively thin and flexible. Accordingly, the upper structure is formed on the polyimide substrate laminated on the rigid glass substrate, and then the polyimide substrate can serve as the substrate 110 of the display device 100 after the removal of the rigid glass substrate. Alternatively, the substrate 110 can include a quartz substrate, a synthetic quartz substrate, a calcium fluoride substrate, a fluoride-doping quartz substrate, a sodalime glass substrate, a non-alkali substrate etc. As display device 100 includes the display region 10 and the peripheral region 20, the substrate 110 can also include the display region 10 and the peripheral region 20.

A buffer layer (not shown) can be disposed on the substrate 110. The buffer layer can be disposed on the entire substrate 110. The buffer layer can prevent the diffusion of metal atoms and/or impurities from the substrate 110. Additionally, the buffer layer can control a rate of a heat transfer in a crystallization process for forming the active layer 130, thereby obtaining substantially uniform the active layer 130. Furthermore, the buffer layer can improve a surface flatness of the substrate 110 when a surface of the substrate 110 is relatively irregular. According to a type of the substrate 110, at least two buffer layers can be provided on the substrate 110, or the buffer layer can not be disposed. For example, the buffer layer is formed of silicon compound, metal oxide, etc.

The semiconductor element 250 can be disposed on the substrate 110. The semiconductor element 250 can be formed of the active layer 130, the gate electrode 170, the source electrode 210, and the drain electrode 230.

The active layer 130 can be disposed in the display region 10 on the substrate 110. The active layer 130 can be formed of an oxide semiconductor, an inorganic semiconductor (e.g., amorphous silicon, polysilicon, etc.), an organic semiconductor, etc.

The gate insulation layer 150 can be disposed on the active layer 130. The gate insulation layer 150 can cover the active layer 130 in the display region 10, and can be disposed on the entire substrate 110. In example embodiments, the gate insulation layer 150 sufficiently covers the active layer 130, and has a substantially level surface without a step around the active layer 130. Alternatively, the gate insulation layer 150 can cover the active layer 130, and can be disposed having a substantially uniform thickness along a profile of the active layer 130. The gate insulation layer 150 is formed of a silicon compound, a metal oxide, etc. For example, the gate insulation layer 150 can be formed of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 can be disposed on a portion of the gate insulation layer 150 under which the active layer 130 is located. The gate electrode 170 can be formed of a metal, a metal alloy, metal nitride, conductive metal oxide, transparent conductive materials, etc. For example, the gate electrode 170 is formed of aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These can be used alone or in a suitable combination thereof.

The insulating interlayer 190 can be disposed on the gate electrode 170. The insulating interlayer 190 can cover the gate electrode 170 in the display region 10, and can be disposed on the entire gate insulation layer 150. In example embodiments, the insulating interlayer 190 sufficiently covers the gate electrode 170 on the gate insulation layer 150, and has a substantially level surface without a step around the gate electrode 170. Alternatively, the insulating interlayer 190 can cover the gate electrode 170 on the gate insulation layer 150, and can be disposed having a substantially uniform thickness along a profile of the gate electrode 170. The insulating interlayer 190 can include a silicon compound, a metal oxide, etc.

The source electrode 210 and the drain electrode 230 can be disposed in the display region 10 on the insulating interlayer 190. The source electrode 210 can be in contact with a first side of the active layer 130 via a contact hole formed by removing a portion of the gate insulation layer 150 and the insulating interlayer 190. The drain electrode 230 can be in contact with a second side of the active layer 130 via a contact hole formed by removing another portion of the gate insulation layer 150 and the insulating interlayer 190. The source electrode 210 and the drain electrode 230 can be formed of a metal, an alloy, metal nitride, conductive metal oxide, transparent conductive materials, etc. These can be used alone or in a suitable combination thereof.

The first power supply voltage line 350, the second power supply voltage line 470, the first block member 445, and the second block member 450 can be disposed in the peripheral region 20 on the insulating interlayer 190.

The first power supply voltage line 350 can be spaced apart from the first block member 445 in a first direction on the insulating interlayer 190. Here, the first direction is a direction that is from the peripheral region 20 into the display region 10. In example embodiments, a low power supply voltage is applied to the first power supply voltage line 350. The upper electrode 340 can be in contact with the first power supply voltage line 350, and the lower power supply voltage can be applied to the upper electrode 340.

The second power supply voltage line 470 can be spaced apart from first power supply voltage line 350 in the first direction on the insulating interlayer 190. In example embodiments, a high power supply voltage is applied to the second power supply voltage line 470. The lower electrode 290 can be electrically connected to the second power supply voltage line 470, and the high power supply voltage can be applied to the lower electrode 290. Each of the first power supply voltage line 350 and the second power supply voltage line 470 can be formed of a metal, an alloy, metal nitride, conductive metal oxide, transparent conductive materials, etc. These can be used alone or in a suitable combination thereof. The first and second power supply voltage lines 350 and 470 and the source and drain electrodes 210 and 230 can be substantially simultaneously (or concurrently) formed using the same materials. In some example embodiments, scan lines, data lines, light emission signal lines, initial voltage lines, etc. are additionally disposed. The lines and the gate electrode 170 can be substantially simultaneously (or concurrently) formed using the same materials. Alternatively, the lines and the source and drain electrodes 210 and 230 can be substantially simultaneously (or concurrently) formed using the same materials.

The first block member 445 can have a first height T1, and can surround the display structure, the semiconductor element 250, the first power supply voltage line 350, and the second power supply voltage line 470. The first height T1 can be a height that is from an upper surface of the insulating interlayer 190 to an upper surface of the first block member 445. On the other hand, the first height T1 can be a height that is from an upper surface of the substrate 110 to an upper surface of the first block member 445. The first block member 445 can block leakage of the second encapsulation layer 370. The first block member 445, the upper block pattern 454, and the pixel defining layer 310 can be substantially simultaneously (or concurrently) formed using the same materials.

The second block member 450 can be spaced apart from the first block member 445 in a second direction. Here, the second direction is a direction that is opposite to the first direction. In addition, the second block member 450 can surround the first block member 445, and can have a second height T2 that is greater than the first height T1. The second height T2 can be a height that is from an upper surface of the insulating interlayer 190 to an upper surface of the second block member 450. On the other hand, the second height T2 can be a height that is from an upper surface of the substrate 110 to an upper surface of the second block member 450. The second block member 450 can support a mask that is used in a process forming the display structure (e.g., the light emitting layer 330 and the upper electrode 340), and can block leakage of the second encapsulation layer 370. In example embodiments, the second block member 450 includes the lower block pattern 452 and the upper block pattern 454. The lower block pattern 452 can be disposed on the insulating interlayer 190, and the upper block pattern 454 can be disposed on the lower block pattern 452. The lower block pattern 452 and the planarization layer 270 can be substantially simultaneously (or concurrently) formed using the same materials, and the upper block pattern 454, the first block member 445, and the pixel defining layer 310 can be substantially simultaneously (or concurrently) formed using the same materials.

In example embodiments, a height ratio of the first height T1 and the second height T2 can consist essentially of a height ratio of about 0.6:1 to about 0.8:1. For example, a height of the second block member 450 can be about 3.3 micrometers such that the second block member 450 is in contact with the mask that is used in a process forming the display structure. A height of the first block member 445 can be about 2.6 micrometers such that the first block member 445 blocks leakage of the second encapsulation layer 370 and is spaced apart from the mask that is used in a process forming the display structure. For example, when the mask is in contact with the first block member 445, an upper surface of the first block member 445 can be scratched (e.g., a cracked). In this case, a defect of the thin film encapsulation structure 400 can occur on the first block member 445 due to the scratch. For example, because of the scratch of an upper surface of the first block member 445, the first encapsulation layer 385 can be cut (e.g., broken) in an upper surface of the first block member 445, and the first block member 445 and the second encapsulation layer 370 can directly contact each other in the cut portion. Since the first block member 445 and the second encapsulation layer 370 are formed of organic materials, water or moisture can be permeated into the display region 10 through the first block member 445 and the second encapsulation layer 370. As a result, the display device 100 can be damaged. To prevent the cut phenomenon of the first encapsulation layer 385 in an upper surface of the first block member 445, a height of the first block member 445 can be less than that of the second block member 450. Each of the first block member 445 and the second block member 450 can be formed of organic materials or inorganic materials. In example embodiments, each of the first block member 445 and the second block member 450 is formed of organic materials. For example, each of the first block member 445 and the second block member 450 are formed of a polyimide-based resin, a photoresist, an acryl-based resin, a polyamide-based resin, a siloxane-based resin, etc.

In example embodiments, the first block member 445 and the second block member 450 are substantially simultaneously (or concurrently) formed using a half tone slit mask such that a height of the first block member 445 is less than that of the second block member 450. For example, after a preliminary planarization layer is formed on the insulating interlayer 190, the lower block pattern 452 in the peripheral region 20 and the planarization layer 270 in the display region 10 can be formed by partially removing the preliminary planarization layer. After the lower block pattern 452 and the planarization layer 270 are formed, a preliminary pixel defining layer can be disposed as the second height T2 on the entire insulating interlayer 190, and then the preliminary pixel defining layer can be partially removed using the half tone slit mask. The half tone slit mask can include an opening region, a light shielding region, a slit region, and a transflective region. The preliminary pixel defining layer can be completely removed in the opening region, and can be not removed in the light shielding region. In addition, the preliminary pixel defining layer can be partially removed in the transflective and slit regions. Here, compared to the slit region, the transflective region can further remove the preliminary pixel defining layer. That is, the first height T1 of the first block member 445 can be higher than a height of an upper surface of the pixel defining layer 310. The pixel defining layer 310 can be formed in the transflective region of the half tone slit mask, and the first block member 445 can be formed in the slit region of the half tone slit mask. In addition, the lower block pattern 452 and the upper block pattern 454 can be formed in the light shielding region of the half tone slit mask. A remaining portion except the pixel defining layer 310, the first block member 445, the lower block pattern 452, and the upper block pattern 454 can be located in the opening region, and the preliminary pixel defining layer can be completely removed. In a process, an upper surface of the first block member 445 that is located under the slit region can be irregular (e.g., uneven). In example embodiments, as illustrated in FIG. 3, an upper surface of the first block member 445 includes a plurality of recesses 441. Alternatively, as illustrated in FIGS. 4 and 5, an upper surface of the first block member 445 can include a concave and convex structure.

The planarization layer 270 can be disposed on the source electrode 210, the drain electrode 230, the second power supply voltage line 470, and a portion of the first power supply voltage line 350. The planarization layer 270 can cover the source electrode 210 and the drain electrode 230 in the display region 10 on the insulating interlayer 190, and the second power supply voltage line 470 and a portion of the first power supply voltage line 350 in the peripheral region 20 on the insulating interlayer 190. That is, the planarization layer 270 can be disposed in the display region 10 on the entire insulating interlayer 190. In example embodiments, the planarization layer 270 is disposed as a high thickness to sufficiently cover the source and drain electrodes 210 and 230, the second power supply voltage line 470, and a portion of the first power supply voltage line 350. In this case, the planarization layer 270 can have a substantially flat upper surface, and a planarization process can be further performed on the planarization layer 270 to implement the flat upper surface of the planarization layer 270. Alternatively, the planarization layer 270 can cover the source and drain electrodes 210 and 230, the second power supply voltage line 470, and a portion of the first power supply voltage line 350, and can be disposed having a substantially uniform thickness along a profile of the source and drain electrodes 210 and 230, the second power supply voltage line 470, and a portion of the first power supply voltage line 350. The planarization layer 270 can be formed of organic materials or inorganic materials. In example embodiments, the planarization layer 270 is formed of organic materials.

The lower electrode 290 can be disposed in the display region 10 on the planarization layer 270. The lower electrode 290 can be in contact with the drain electrode 230 via a contact hole formed by removing a portion of the planarization layer 270. In addition, the lower electrode 290 can be electrically connected to the semiconductor element 250. The lower electrode 290 can be formed of a metal, a metal alloy, metal nitride, conductive metal oxide, transparent conductive materials, etc. These can be used alone or in a suitable combination thereof.

The pixel defining layer 310 can expose a portion of the lower electrode 290 in the display region 10 on the planarization layer 270. The pixel defining layer 310 can cover the planarization layer 270 in the peripheral region 20 on the planarization layer 270, and can be in contact with an upper surface of the first power supply voltage line 350. In this case, the light emitting layer 330 can be disposed on the portion of the lower electrode 290 exposed by the pixel defining layer 310. The pixel defining layer 310 can be formed of organic materials or inorganic materials. In example embodiments, the pixel defining layer 310 is formed of organic materials.

The light emitting layer 330 can be disposed in a portion where the portion of the lower electrode 290 is exposed. The light emitting layer 330 can be formed using at least one of light emitting materials that can generate different colors of light (e.g., a red color of light, a blue color of light, and a green color of light, etc.) according to sub-pixels. Alternatively, the light emitting layer 330 can generally generate a white color of light by stacking a plurality of light emitting materials that can generate different colors of light such as a red color of light, a green color of light, a blue color of light, etc. In this case, a color filter can be disposed on the light emitting layer 330. The color filter can include at least one selected from a red color filter, a green color filter, and a blue color filter. Alternatively, the color filter can include a yellow color filter, a cyan color filter, and a magenta color filter. The color filter can be formed of a photosensitive resin (or color photoresist), etc.

The upper electrode 340 can be disposed on the pixel defining layer 310, the light emitting layer 330, and a portion of the first power supply voltage line 350. As described above, a lower power supply voltage can be applied to the upper electrode 340 through the first power supply voltage line 350. The upper electrode 340 can be formed of a metal, a metal alloy, metal nitride, conductive metal oxide, transparent conductive materials, etc.

The thin film encapsulation structure 400 can be disposed on the upper electrode 340, the first power supply voltage line 350, the first block member 445, and the second block member 450. The thin film encapsulation structure 400 can include the first encapsulation layer 385, the second encapsulation layer 370, and the third encapsulation layer 390. For example, the second encapsulation layer 370 is disposed on the first encapsulation layer 385, and the third encapsulation layer 390 can be disposed on the second encapsulation layer 370. In example embodiments, the first encapsulation layer 385 is disposed on the upper electrode 340, the first power supply voltage line 350, the first block member 445, and the second block member 450. The first encapsulation layer 385 can cover the upper electrode 340, the first power supply voltage line 350, the first block member 445, and the second block member 450, and can be disposed having a substantially uniform thickness along a profile of the upper electrode 340, the first power supply voltage line 350, the first block member 445, and the second block member 450. The first encapsulation layer 385 can prevent the display structure from being deteriorated by the permeation of moisture, water, oxygen, etc. In addition, the first encapsulation layer 385 can protect the display structure from external impacts. The first encapsulation layer 385 can be formed of inorganic materials.

The second encapsulation layer 370 can be disposed in the display region 10 and a portion of the peripheral region 20 on the first encapsulation layer 385. The second encapsulation layer 370 can improve the flatness of the display device 100, and can protect the display structure disposed in the display region 10. The second encapsulation layer 370 can be formed of organic materials. In example embodiments, the second encapsulation layer 370 overlaps at least a portion of the first block member 445.

The third encapsulation layer 390 can be disposed on the first encapsulation layer 385 disposed in the peripheral region 20 and the second encapsulation layer 370. The third encapsulation layer 390 can cover the first encapsulation layer 385 disposed in the peripheral region 20 and the second encapsulation layer 370, and can be disposed having a substantially uniform thickness along a profile of the first encapsulation layer 385 disposed in the peripheral region 20 and the second encapsulation layer 370. The third encapsulation layer 390 together with the first encapsulation layer 385 and the second encapsulation layer 370 can prevent the display structure from being deteriorated by the permeation of moisture, water, oxygen, etc. In addition, the third encapsulation layer 390 together with the first encapsulation layer 385 and the second encapsulation layer 370 can protect the display structure from external impacts. The third encapsulation layer 390 can be formed of inorganic materials. In example embodiments, the first encapsulation layer 385 and the third encapsulation layer 390 contact each other on the second block member 450.

Alternatively, the thin film encapsulation structure 400 can have five layers structure where first to fifth encapsulation layers are stacked or seven layers structure where the first to seventh encapsulation layers are stacked.

The display device 100 in accordance with example embodiments can include the first block member 445 having the first height T1 and the second block member 450 having the second height T2 that is higher than the first height T1. Accordingly, as an upper surface of the first block member 445 is not contact with a mask that is used in a process forming the display structure, the first encapsulation layer 385 can be not cut in an upper surface of the first block member 445, and the display device 100 can protect the display structure from water or moisture.

FIGS. 6 through 19 are cross-sectional views illustrating a method of manufacturing a display device in accordance with example embodiments.

Figure 6:
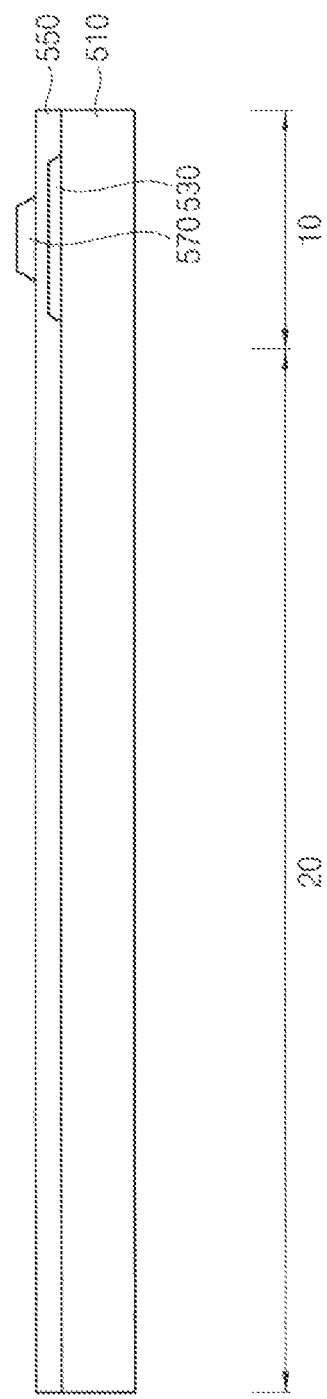
FIGS. 6, 7, 8, 9, 10, 11, 12, 13, 14, 15, 16, 17, 18, and 19 are cross-sectional views illustrating a method of manufacturing a display device in accordance with example embodiments.

Referring to FIG. 6, a substrate 510 including a display region 10 and a peripheral region 20 is provided. The substrate 510 can be formed of transparent materials. The substrate 510 can be formed using a flexible transparent material such as a flexible transparent resin substrate (e.g., a polyimide substrate). In this case, the polyimide substrate can include a first polyimide layer, a first barrier film layer, a second polyimide layer, a second barrier film layer, etc.

A buffer layer (not shown) can be formed on the substrate 510. The buffer layer can be formed on the entire substrate

510. The buffer layer can be formed using silicon oxide, silicon nitride, silicon oxynitride, etc.

An active layer 530 can be formed in the display region 10 on the substrate 510. The active layer 530 can be formed using an oxide semiconductor, an inorganic semiconductor (e.g., amorphous silicon, polysilicon, etc.), an organic semiconductor, etc.

A gate insulation layer 550 can be formed on the active layer 530. The gate insulation layer 550 can cover the active layer 530 in the display region 10, and can be formed on the entire substrate 510. The gate insulation layer 550 can sufficiently cover the active layer 530, and can have a substantially level surface without a step around the active layer 530. Alternatively, the gate insulation layer 550 can cover the active layer 530 on the substrate 510, and can be formed having a substantially uniform thickness along a profile of the active layer 530. The gate insulation layer 550 can be formed of a silicon compound, a metal oxide, etc. For example, the gate insulation layer 550 is formed using SiOx, SiNx, SiOxNy, SiOxCy, SiCxNy, AlOx, AlNx, TaOx, HfOx, ZrOx, TiOx, etc.

A gate electrode 570 can be formed on a portion of the gate insulation layer 550 under which the active layer 530 is located. The gate electrode 570 can be formed of a metal, a metal alloy, metal nitride, conductive metal oxide, transparent conductive materials, etc. For example, the gate electrode 570 is formed using Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These can be used alone or in a suitable combination thereof.

Figure 7:
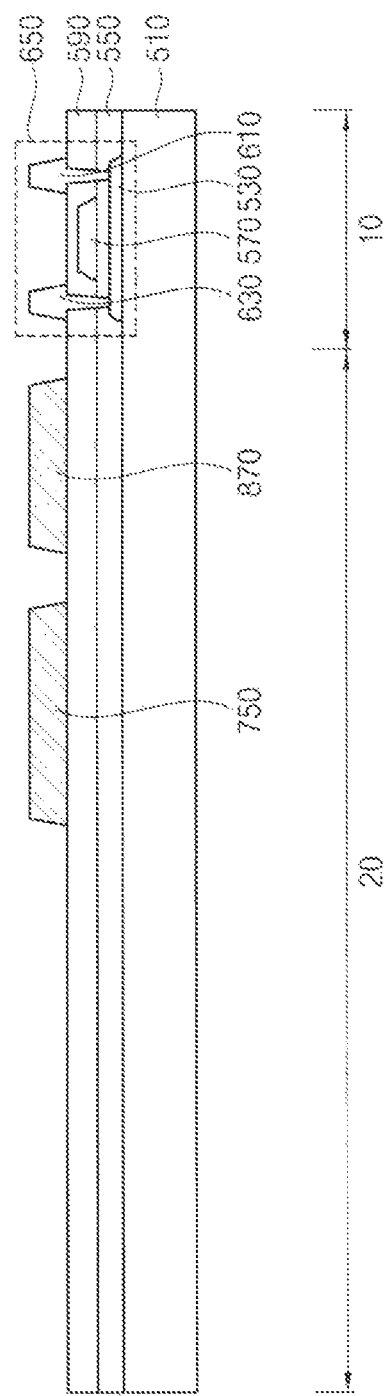

Referring to FIG. 7, an insulating interlayer 590 is formed on the gate electrode 570. The insulating interlayer 590 can cover the gate electrode 570 in the display region 10 on the gate insulation layer 550, and can be formed on the entire gate insulation layer 550. The insulating interlayer 590 can sufficiently cover the gate electrode 570 on the gate insulation layer 550, and can have a substantially level surface without a step around the gate electrode 570. Alternatively, the insulating interlayer 590 can cover the gate electrode 570 on the gate insulation layer 550, and can be formed having a substantially uniform thickness along a profile of the gate electrode 570. The insulating interlayer 590 can be formed using a silicon compound, a metal oxide, etc.

A source electrode 610 and a drain electrode 630 can be formed in the display region 10 on the insulating interlayer 590. The source electrode 610 can be in contact with a first side of the active layer 530 via a contact hole formed by removing a portion of the gate insulation layer 550 and the insulating interlayer 590. The drain electrode 630 can be in contact with a second side of the active layer 530 via a contact hole formed by removing another portion of the gate insulation layer 550 and the insulating interlayer 590. Each of the source electrode 610 and the drain electrode 630 can be formed using a metal, an alloy, metal nitride, conductive metal oxide, transparent conductive materials, etc. These can be used alone or in a suitable combination thereof. Accordingly, a semiconductor element 650 including the active layer 530, the gate electrode 570, the source electrode 610, and the drain electrode 630 can be formed.

A first power supply voltage line 750 and a second power supply voltage line 870 can be formed in the peripheral region 20 on the insulating interlayer 590.

The first power supply voltage line 750 can be spaced apart from the drain electrode 630 in a direction from the display region 10 into the peripheral region 20 on the insulating interlayer 590. A low power supply voltage can be applied to the first power supply voltage line 750.

The second power supply voltage line 870 can be formed between the first power supply voltage line 750 and the drain electrode 630 on the insulating interlayer 590. A high power supply voltage can be applied to the second power supply voltage line 870. Each of the first power supply voltage line 750 and the second power supply voltage line 870 can be formed of a metal, an alloy, metal nitride, conductive metal oxide, transparent conductive materials, etc. The first and second power supply voltage lines 750 and 870 and the source and drain electrodes 610 and 630 can be substantially simultaneously (or concurrently) formed using the same materials.

Figure 8:
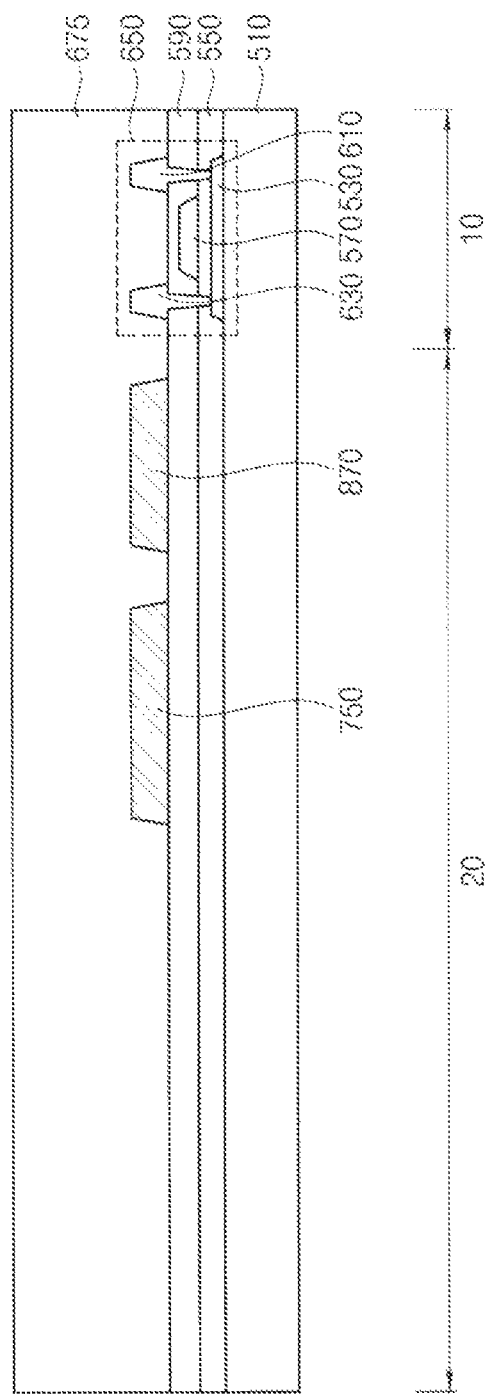

Referring to FIG. 8, a preliminary planarization layer 675 is formed on the insulating interlayer 590. The preliminary planarization layer 675 can cover the first and second power supply voltage lines 750 and 870 and the source and drain electrodes 610 and 630, and can be formed on the entire insulating interlayer 590. The preliminary planarization layer 675 can be formed as a high thickness to sufficiently cover the first and second power supply voltage lines 750 and 870 and the source and drain electrodes 610 and 630. In this case, the preliminary planarization layer 675 can have a substantially flat upper surface, and a planarization process can be further performed on the preliminary planarization layer 675 to implement the flat upper surface of the preliminary planarization layer 675. The preliminary planarization layer 675 can be formed of organic materials or inorganic materials. In example embodiments, the preliminary planarization layer 675 is formed using organic materials.

Figure 9:
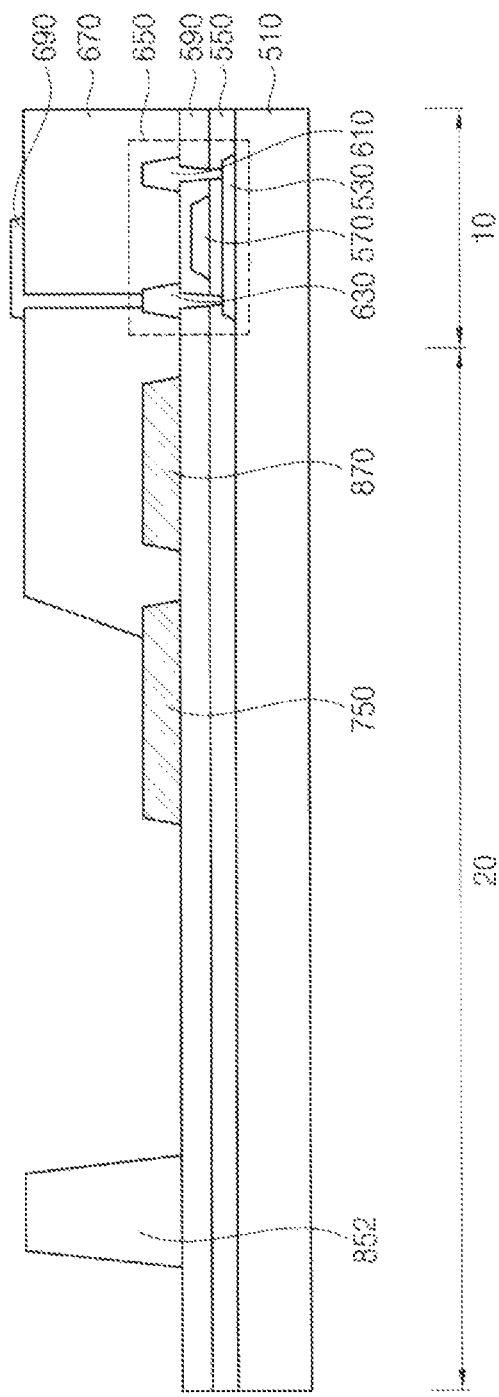

Referring to FIG. 9, a planarization layer 670 in the display region 10 and a lower block pattern 852 in the peripheral region 20 are formed by partially removing the preliminary planarization layer 675. The planarization layer 670 can be formed on the source electrode 610, the drain electrode 630, the second power supply voltage line 870, and a portion of the first power supply voltage line 750. In example embodiments, the lower block pattern 852 and the planarization layer 670 are substantially simultaneously (or concurrently) formed using the same materials.

A lower electrode 690 can be formed in the display region 10 on the planarization layer 670. The lower electrode 690 can be in contact with the drain electrode 630 via a contact hole formed by removing a portion of the planarization layer 670. In addition, the lower electrode 690 can be electrically connected to the semiconductor element 650. The lower electrode 690 can be formed using a metal, a metal alloy, metal nitride, conductive metal oxide, transparent conductive materials, etc. These can be used alone or in a suitable combination thereof.

Figure 10:
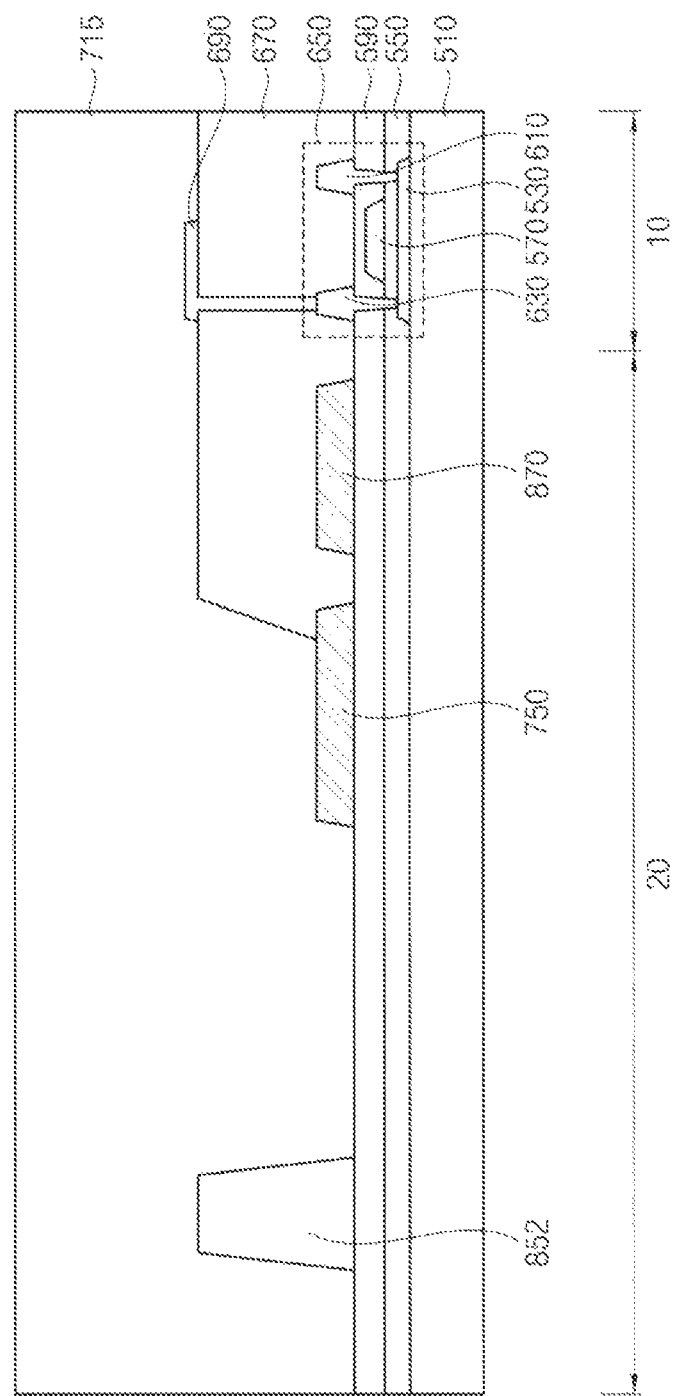

Referring to FIG. 10, a preliminary pixel defining layer 715 is formed on the insulating interlayer 590. The preliminary pixel defining layer 715 can be entirely formed on the lower block pattern 852, the first power supply voltage line 750, the planarization layer 670, and the lower electrode 690. The preliminary pixel defining layer 715 can be formed as a relatively high thickness to cover the lower block pattern 852, the first power supply voltage line 750, the planarization layer 670, and the lower electrode 690. The preliminary pixel defining layer 715 can be formed of organic materials or inorganic materials. In example embodiments, the preliminary pixel defining layer 715 is formed using organic materials.

Figure 11:
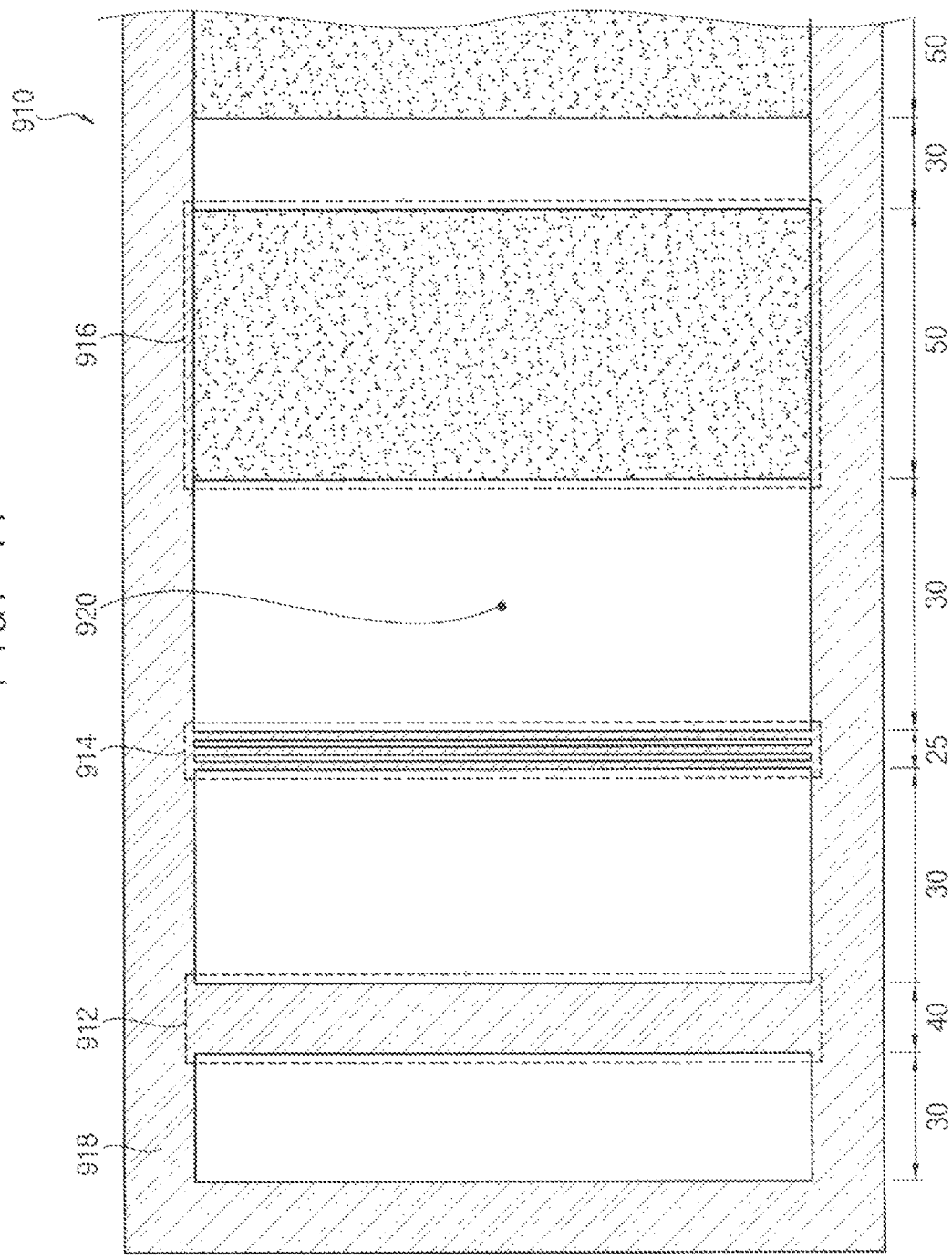
Figure 12:
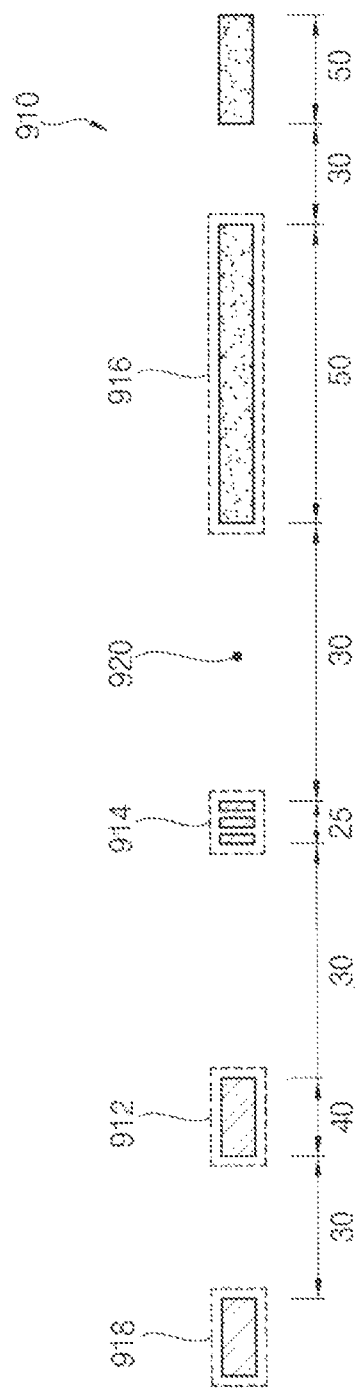
Figure 13:
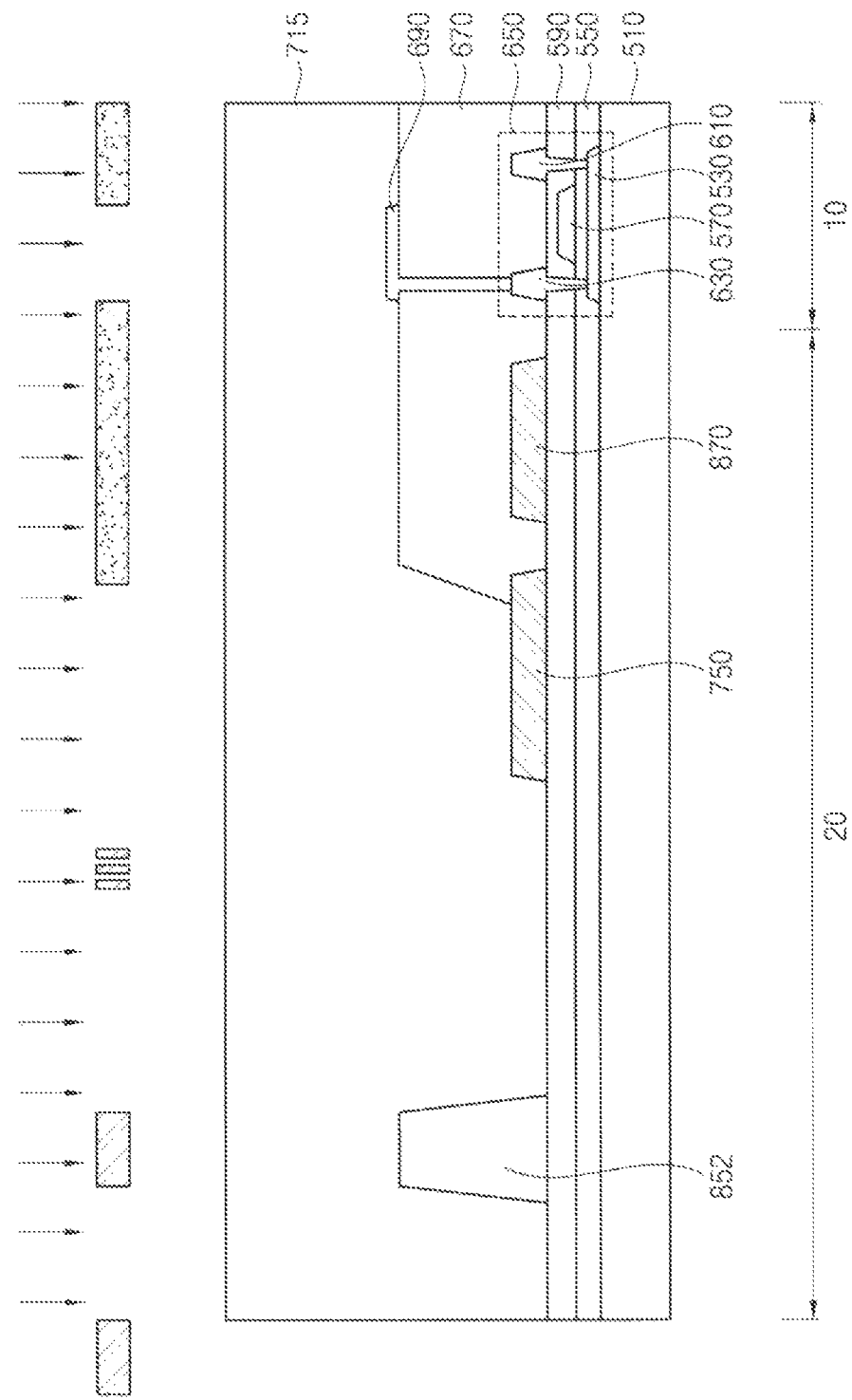

In FIGS. 11 through 13, the preliminary pixel defining layer 715 is partially removed using the half tone slit mask 910. Here, FIG. 11 is a planar view illustrating the half tone slit mask 910. FIG. 12 is a cross-sectional view illustrating the half tone slit mask 910. As illustrated in FIGS. 11 and 12, the half tone slit mask 910 includes an opening region 30, a light shielding region 40, a slit region 25, and a transflective region 50. An opening 920 can be formed in the opening region 30, and a light can travel through the opening 920. A light shielding pattern 912 can be formed in the light shielding region 40, and the light shielding pattern 912 can block a light. A slit pattern 914 can be formed in the slit region 25, and a portion of a light can travel through an opening located between the slit patterns 914. A transflective pattern 916 can be formed in the transflective region 50. Here, a portion of a light can travel through the transflective pattern 916, and a remaining portion of a light can be blocked by the transflective pattern 916. In addition, the half tone slit mask 910 can further include a border region 918 surrounding the opening region 30, the light shielding region 40, the slit region 25, and the transflective region 50. A light can be blocked in the border region 918, and a function of the border region 918 can be the same as that of the light shielding pattern 912. The preliminary pixel defining layer 715 can be completely removed in the opening region 30, and can be not removed in the light shielding region 40. In addition, the preliminary pixel defining layer 715 can be partially removed in the transflective and slit regions 50 and 25. Here, compared to the slit region 25, the transflective region 50 can further remove the preliminary pixel defining layer 715.

Referring again to FIG. 13, the half tone slit mask 910 is located on the preliminary pixel defining layer 715, and a light (e.g., ultra violet ray) is irradiated in the preliminary pixel defining layer 715 through half tone slit mask 910.

Figure 14:
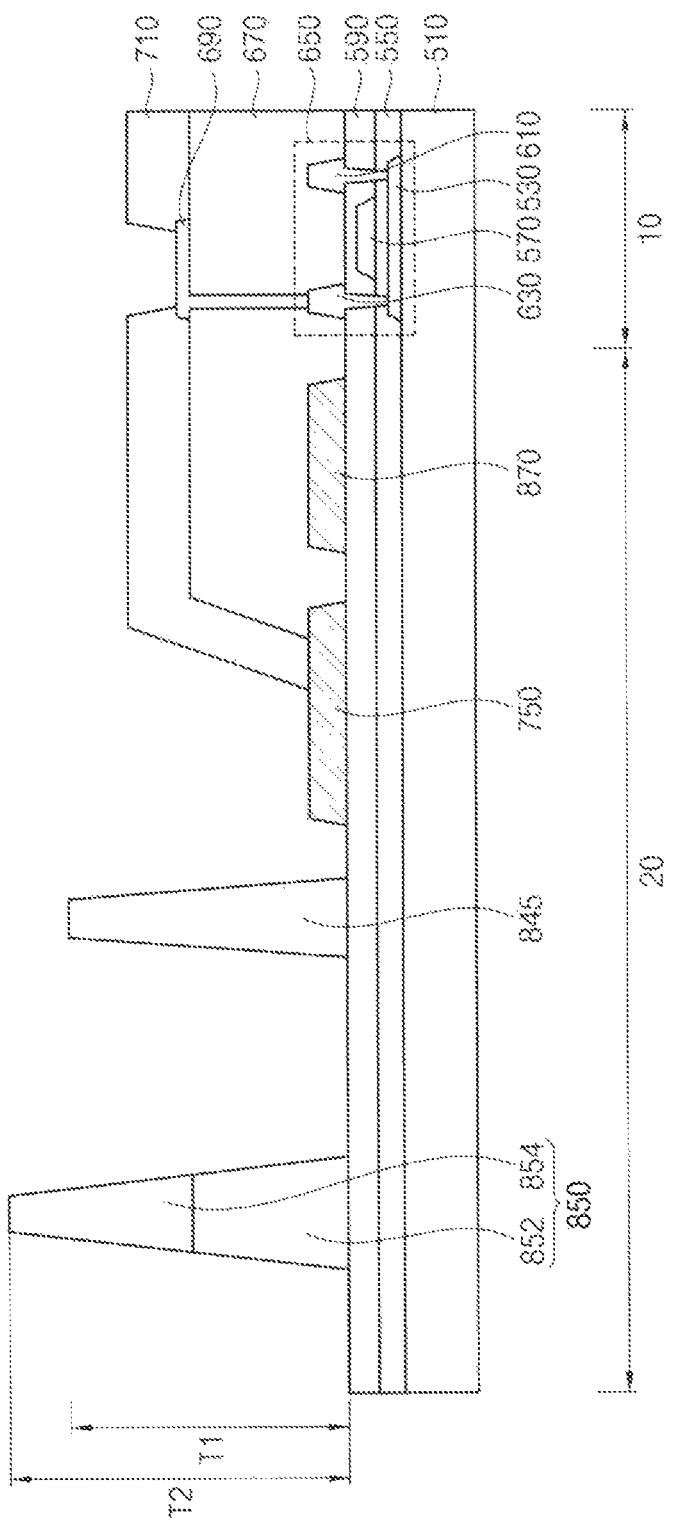

Referring to FIG. 14, a pixel defining layer 710 in the transflective region 50 of the half tone slit mask 910, a first block member 845 in the slit region 25 of the half tone slit mask 910, and an upper block pattern 854 in the light shielding region 40 of the half tone slit mask 910 are formed by partially removing the preliminary pixel defining layer 715. Here, the preliminary pixel defining layer 715 can be completely removed in the opening region 30 of the half tone slit mask 910.

That is, a second block member 850 including the lower block pattern 852 and the upper block pattern 854 can be formed as a second height T2, and the first block member 845 can be formed as a first height T1. Here, the first height T1 of the first block member 845 can be higher than a level of an upper surface of the pixel defining layer 710.

In this process, an upper surface of the first block member 845 that is located under the slit region 25 can be irregular (e.g., uneven). In example embodiments, an upper surface of the first block member 845 can include a plurality of recesses (refer to FIG. 3). Alternatively, an upper surface of the first block member 845 can include a concave and convex structure (refer to FIGS. 4 and 5). Each of the first block member 845 and the second block member 850 can be formed of organic materials. For example, each of the first block member 845 and the second block member 850 is formed using a polyimide-based resin, a photoresist, an acryl-based resin, a polyamide-based resin, a siloxane-based resin, etc.

Figure 15:
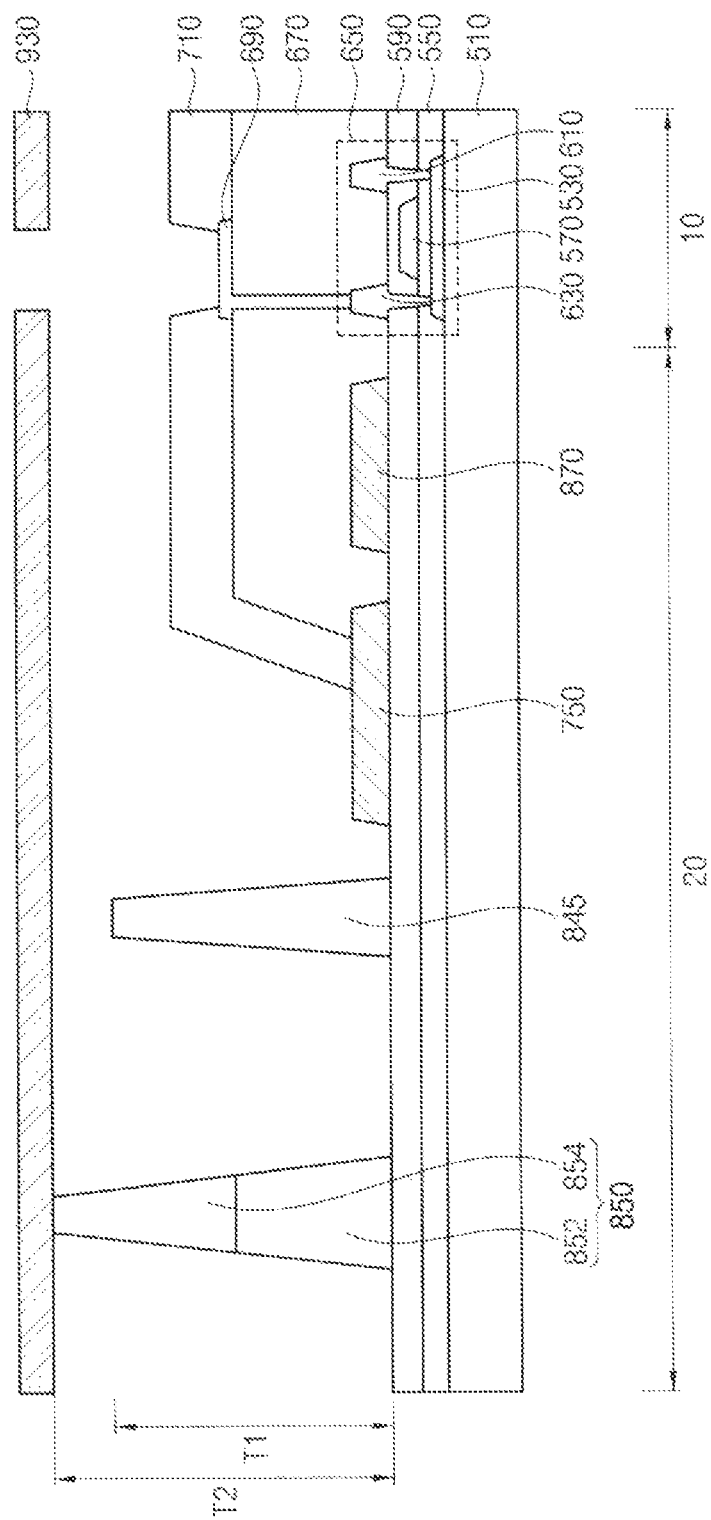
Figure 16:
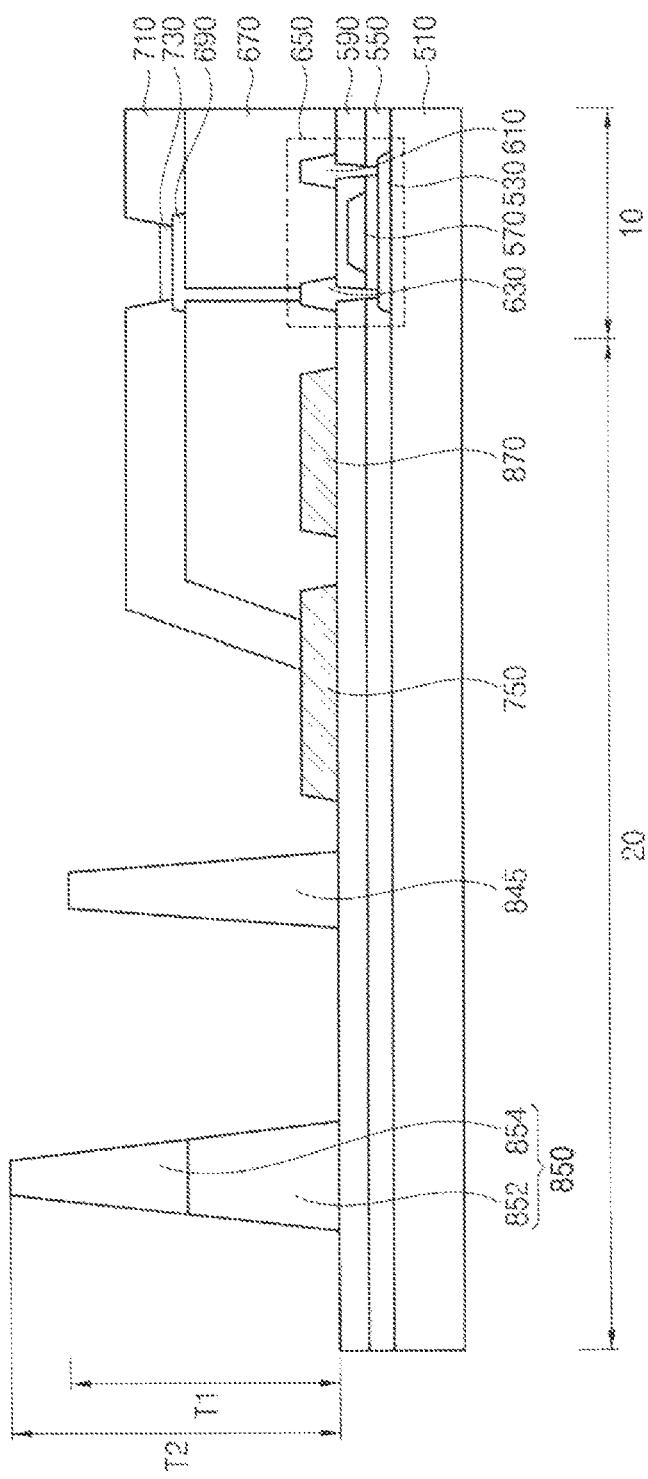

Referring to FIGS. 15 and 16, a first mask 930 is in contact with an upper surface of the second block member 850. In this process, in some embodiments, an upper surface of the first block member 845 is not in contact with the first mask 930. A light emitting layer 730 can be formed through the first mask 930. The light emitting layer 730 can be formed on a portion where at least a portion of the lower electrode 690 is exposed. The light emitting layer 730 can be formed using at least one of light emitting materials capable of generating different colors of light (e.g., a red color of light, a blue color of light, and a green color of light, etc.) according to sub-pixels. Alternatively, the light emitting layer 730 can generally generate a white color of light by stacking a plurality of light emitting materials that can generate different colors of light such as a red color of light, a green color of light, a blue color of light, etc.

Figure 17:
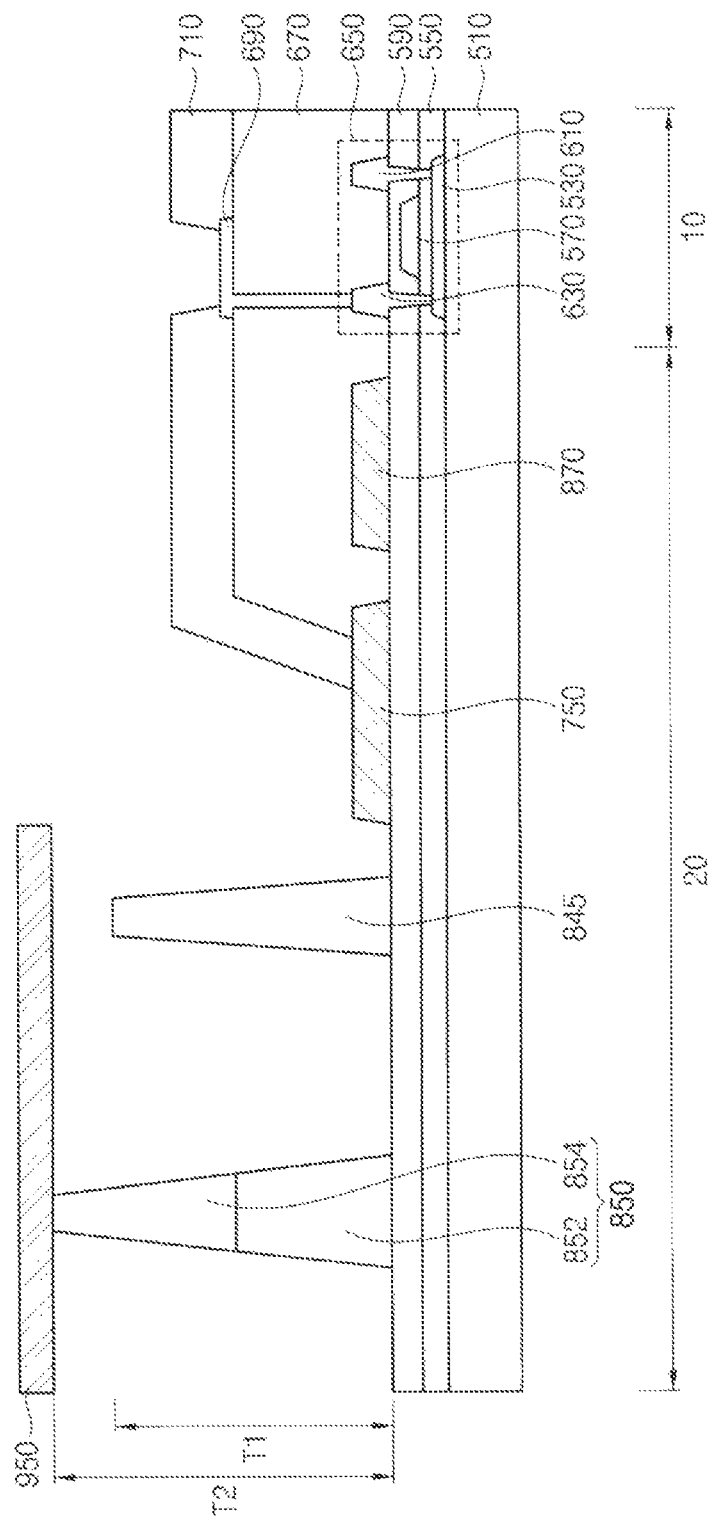
Figure 18:
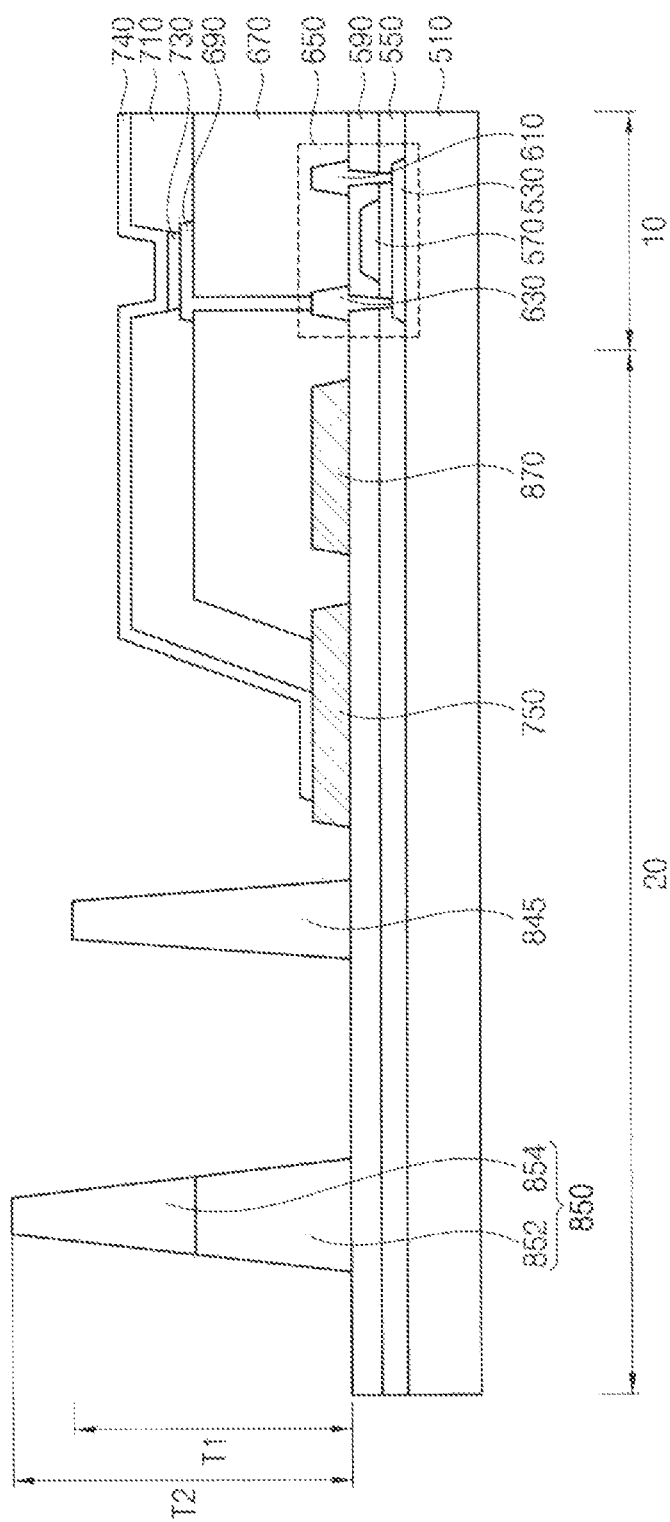

Referring to FIGS. 17 and 18, a second mask 950 is in contact with an upper surface of the second block member 850. In this process, in some embodiments, an upper surface of the first block member 845 is not in contact with the second mask 950. An upper electrode 740 can be formed through the second mask 950.

The upper electrode 740 can be formed on the pixel defining layer 710, the light emitting layer 730, and a portion of the first power supply voltage line 750. A lower power supply voltage can be applied to the upper electrode 740 through the first power supply voltage line 750. The upper electrode 740 can be formed using a metal, a metal alloy, metal nitride, conductive metal oxide, transparent conductive materials, etc. Accordingly, a display structure including the lower electrode 690, the light emitting layer 730, and the upper electrode 740 can be formed.

Figure 19:
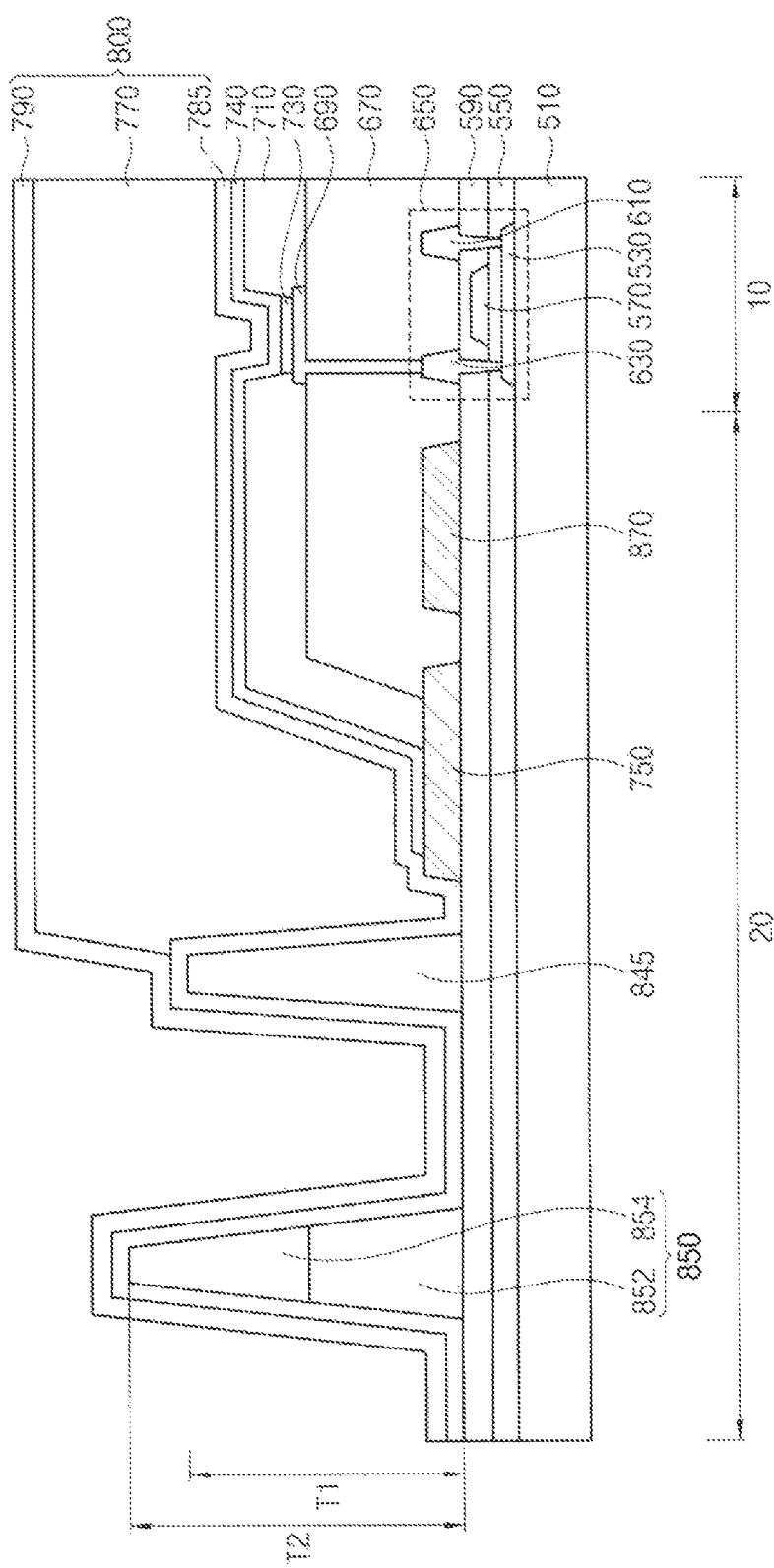

Referring to FIG. 19, a thin film encapsulation structure 800 is formed on the upper electrode 740, the first power supply voltage line 750, the first block member 845, and the second block member 850. The thin film encapsulation structure 800 can include the first encapsulation layer 785, the second encapsulation layer 770, and the third encapsulation layer 790. For example, the second encapsulation layer 770 is formed on the first encapsulation layer 785, and the third encapsulation layer 790 is disposed on the second encapsulation layer 770. The first encapsulation layer 785 can be disposed on the upper electrode 740, the first power supply voltage line 750, the first block member 845, and the second block member 850. The first encapsulation layer 785 can cover the upper electrode 740, the first power supply voltage line 750, the first block member 845, and the second block member 850, and can be formed having a substantially uniform thickness along a profile of the upper electrode 740, the first power supply voltage line 750, the first block member 845, and the second block member 850. The first encapsulation layer 785 can prevent the display structure from being deteriorated by the permeation of moisture, water, oxygen, etc. In addition, the first encapsulation layer 785 can protect the display structure from external impacts. The first encapsulation layer 785 can be formed using inorganic materials.

The second encapsulation layer 770 can be formed in the display region 10 and a portion of the peripheral region 20 on the first encapsulation layer 785. The second encapsulation layer 770 can improve the flatness of a display device, and can protect the display structure disposed in the display region 10. The second encapsulation layer 770 can be formed using organic materials. In example embodiments, the second encapsulation layer 770 overlaps at least a portion of the first block member 845.

The third encapsulation layer 790 can be formed on the first encapsulation layer 785 formed in the peripheral region 20 and the second encapsulation layer 770. The third encapsulation layer 790 can cover the first encapsulation layer 785 formed in the peripheral region 20 and the second encapsulation layer 770, and can be disposed having a substantially uniform thickness along a profile of the first encapsulation layer 785 formed in the peripheral region 20 and the second encapsulation layer 770. The third encapsulation layer 790 together with the first encapsulation layer 785 and the second encapsulation layer 770 can prevent the display structure from being deteriorated by the permeation of moisture, water, oxygen, etc. In addition, the third encapsulation layer 790 together with the first encapsulation layer 785 and the second encapsulation layer 770 can protect the display structure from external impacts. The third encapsulation layer 790 can be formed of inorganic materials. In example embodiments, the first encapsulation layer 785 and the third encapsulation layer 790 are in contact with each other on the second block member 850. Accordingly, the display device 100 illustrated in FIG. 2 can be manufactured.

Figure 20:
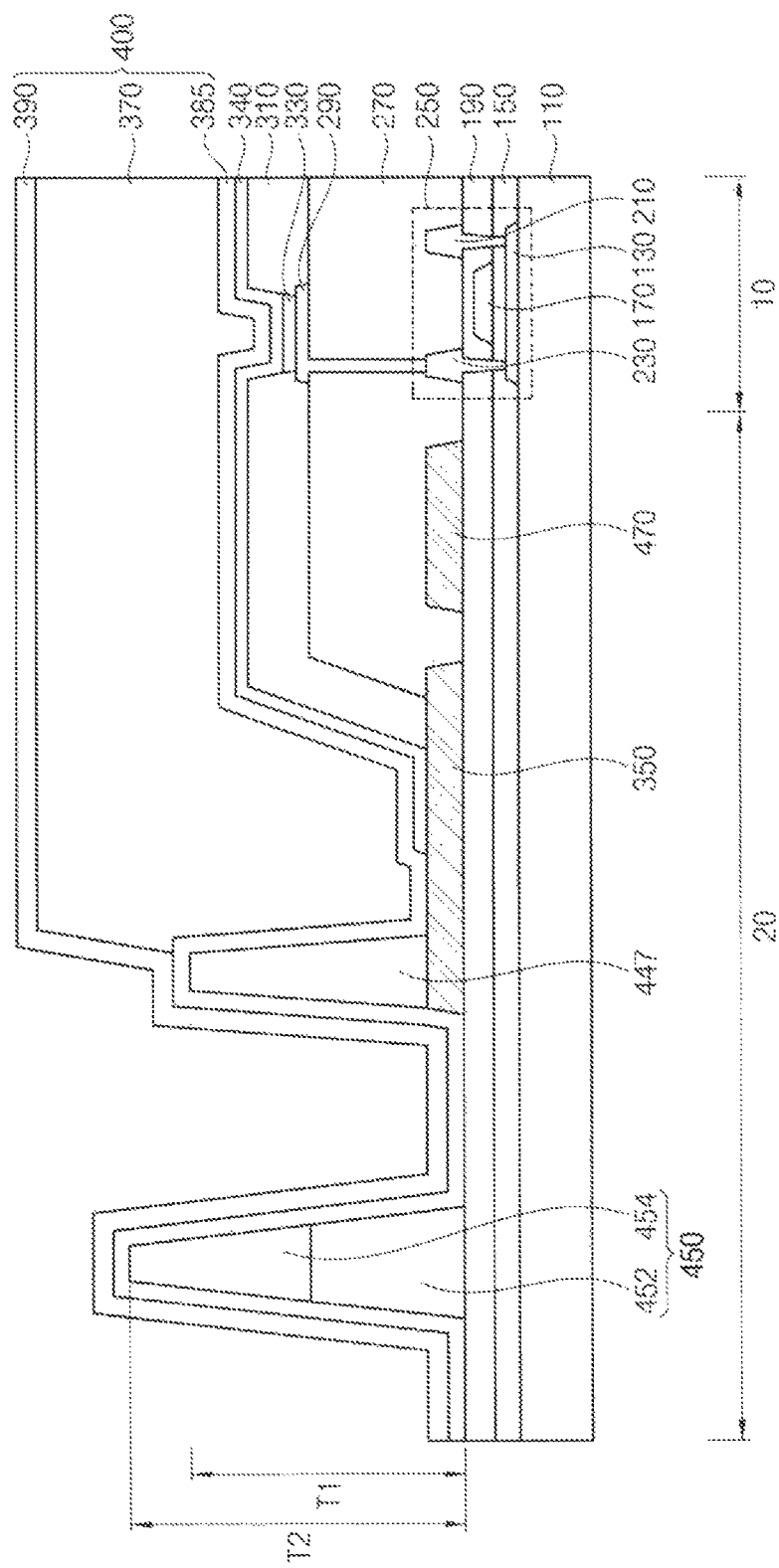
FIG. 20 is a cross-sectional view illustrating a display device in accordance with example embodiments.

FIG. 20 is a cross-sectional view illustrating a display device in accordance with example embodiments. A display device illustrated in FIG. 20 can have a configuration substantially the same as or similar to that of a display device 100 described with reference to FIG. 2 except a first block member 447. In FIG. 20, detailed descriptions for elements, which are substantially the same as or similar to the elements described with reference to FIG. 2, will be omitted.

Referring to FIG. 20, a display device includes a substrate 110, a semiconductor element 250, a gate insulation layer 150, an insulating interlayer 190, a planarization layer 270, a first power supply voltage line 350, a second power supply voltage line 470, a display structure, a pixel defining layer 310, first block member 447, a second block member 450, a thin film encapsulation structure 400, etc. Here, the display structure can include a lower electrode 290, a light emitting layer 330, and an upper electrode 340, and the semiconductor element 250 can include an active layer 130, a gate electrode 170, a source electrode 210, and a drain electrode 230. The thin film encapsulation structure 400 can include a first encapsulation layer 385, a second encapsulation layer 370, and a third encapsulation layer 390. In addition, the second block member 450 can include a lower block pattern 452 and an upper block pattern 454.

The first block member 447 can be disposed on the first power supply voltage line 350. The first block member 447 can surround the display structure, the semiconductor element 250, and the second power supply voltage line 470.

A first height T1 can be a height that is from an upper surface of the insulating interlayer 190 to an upper surface of the first block member 447. For example, the first height T1 is a sum of a height of the first power supply voltage line 350 and a height of the first block member 447.

The first block member 447 can be formed using a half tone slit mask. In this case, although the first block member 447 is disposed on the first power supply voltage line 350, a height of an upper surface of the first block member 447 can be lower than that of an upper surface of the second block member 450. Accordingly, in some embodiments, an upper surface of the first block member 447 is not in contact with a mask used in a process forming the display structure.

Figure 21:
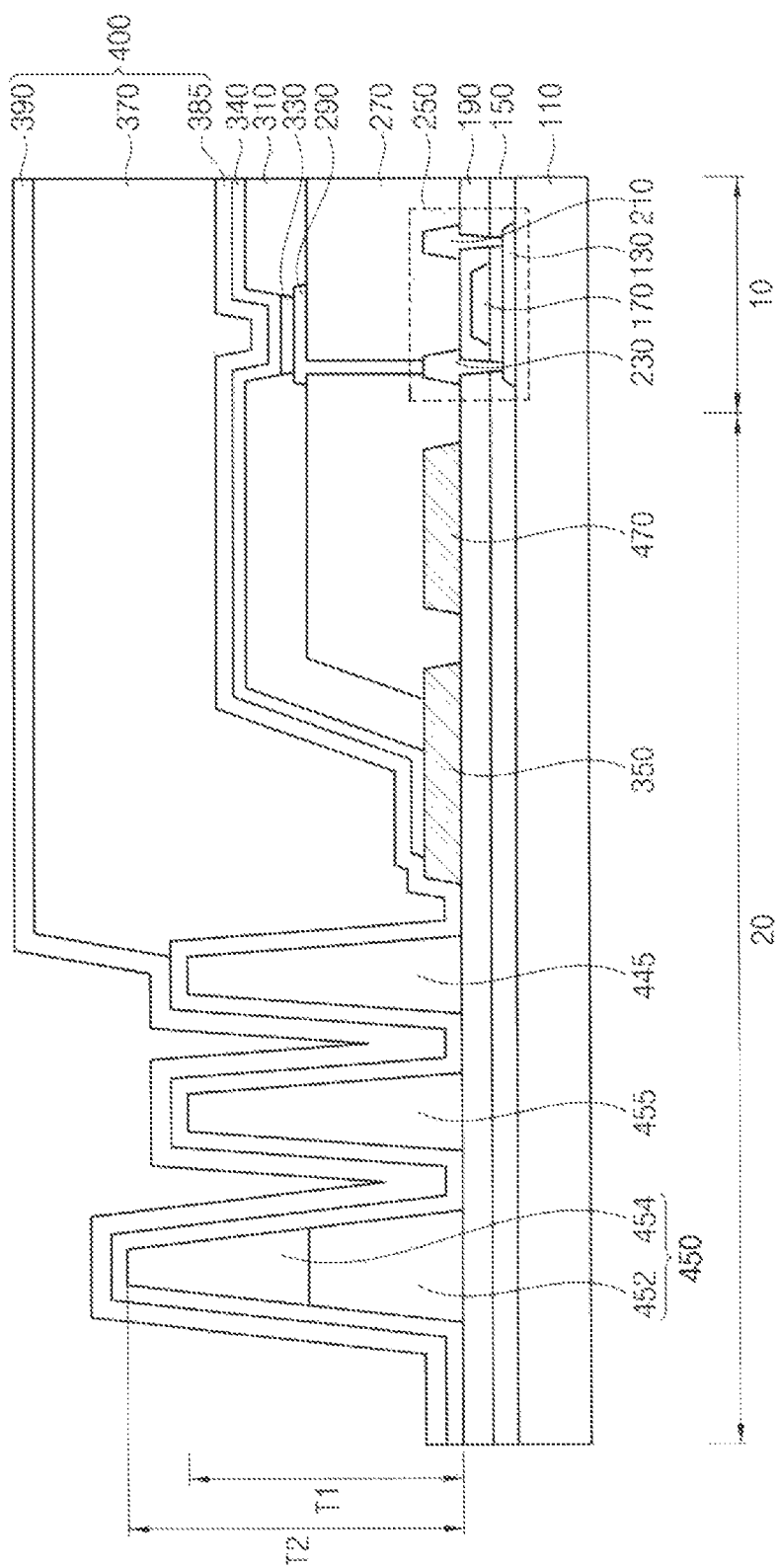
FIG. 21 is a cross-sectional view illustrating a display device in accordance with example embodiments.
Figure 22:
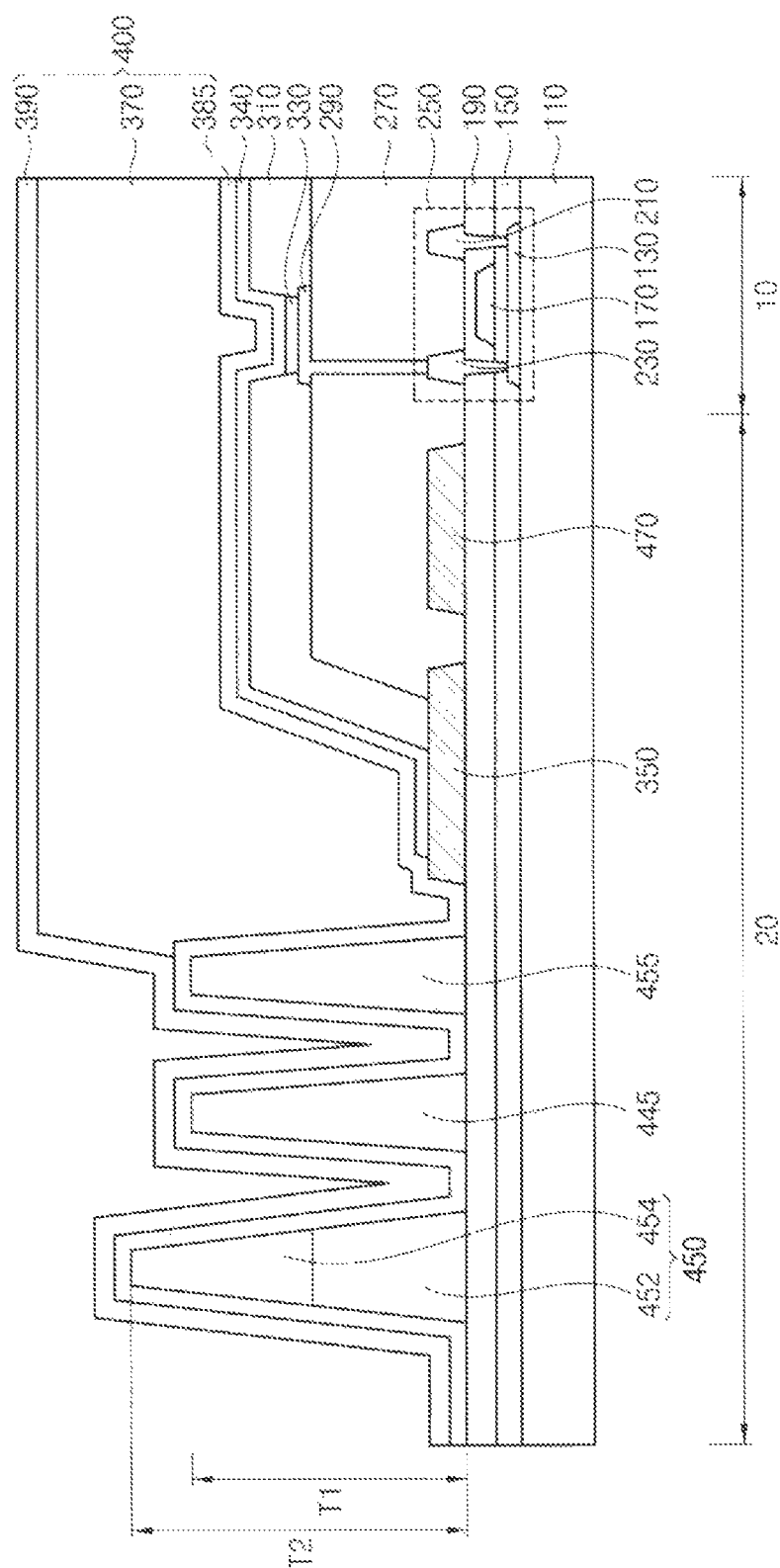
FIG. 22 is a cross-sectional view illustrating a display device in accordance with example embodiments.

FIG. 21 is a cross-sectional view illustrating a display device in accordance with example embodiments. FIG. 22 is a cross-sectional view illustrating a display device in accordance with example embodiments. A display device illustrated in FIGS. 21 and 22 can have a configuration substantially the same as or similar to that of a display device 100 described with reference to FIG. 2 except a third block member 455. In FIGS. 21 and 22, detailed descriptions for elements, which are substantially the same as or similar to the elements described with reference to FIG. 2, will be omitted.

Referring to FIG. 21, a display device includes a substrate 110, a semiconductor element 250, a gate insulation layer 150, an insulating interlayer 190, a planarization layer 270, a first power supply voltage line 350, a second power supply voltage line 470, a display structure, a pixel defining layer 310, first block member 445, a second block member 450, a third block member 455, a thin film encapsulation structure 400, etc. Here, the display structure can include a lower electrode 290, a light emitting layer 330, and an upper electrode 340, and the semiconductor element 250 can include an active layer 130, a gate electrode 170, a source electrode 210, and a drain electrode 230. The thin film encapsulation structure 400 can include a first encapsulation layer 385, a second encapsulation layer 370, and a third encapsulation layer 390. In addition, the second block member 450 can include a lower block pattern 452 and an upper block pattern 454.

The third block member 455 can be disposed in the peripheral region 20 on the insulating interlayer 190. In example embodiments, the third block member 455 is spaced apart from the first block member 445 in a direction from the peripheral region 20 into a display region 10, and can have a first height T1. Alternatively, as illustrated in FIG. 22, the first block member 445 is disposed between the third block member 455 and the second block member 450, and the third block member 455, the first block member 445, and the second block member 450 can be spaced apart from each other. In addition, the third block member 455 can have a first height T1.

The first block member 445, the second block member 450, and the third block member 455 can be substantially simultaneously (or concurrently) formed using a half tone slit mask, and each of the first block member 445 and the third block member 455 can be formed in a slit region of the half tone slit mask. Accordingly, an upper surface of each of the first block member 445 and the third block member 455 can be irregular.

In example embodiments, as the display device includes the first block member 445, the second block member 450, and the third block member 455, leakage of the second encapsulation layer 370 can be relatively readily blocked.

Figure 23:
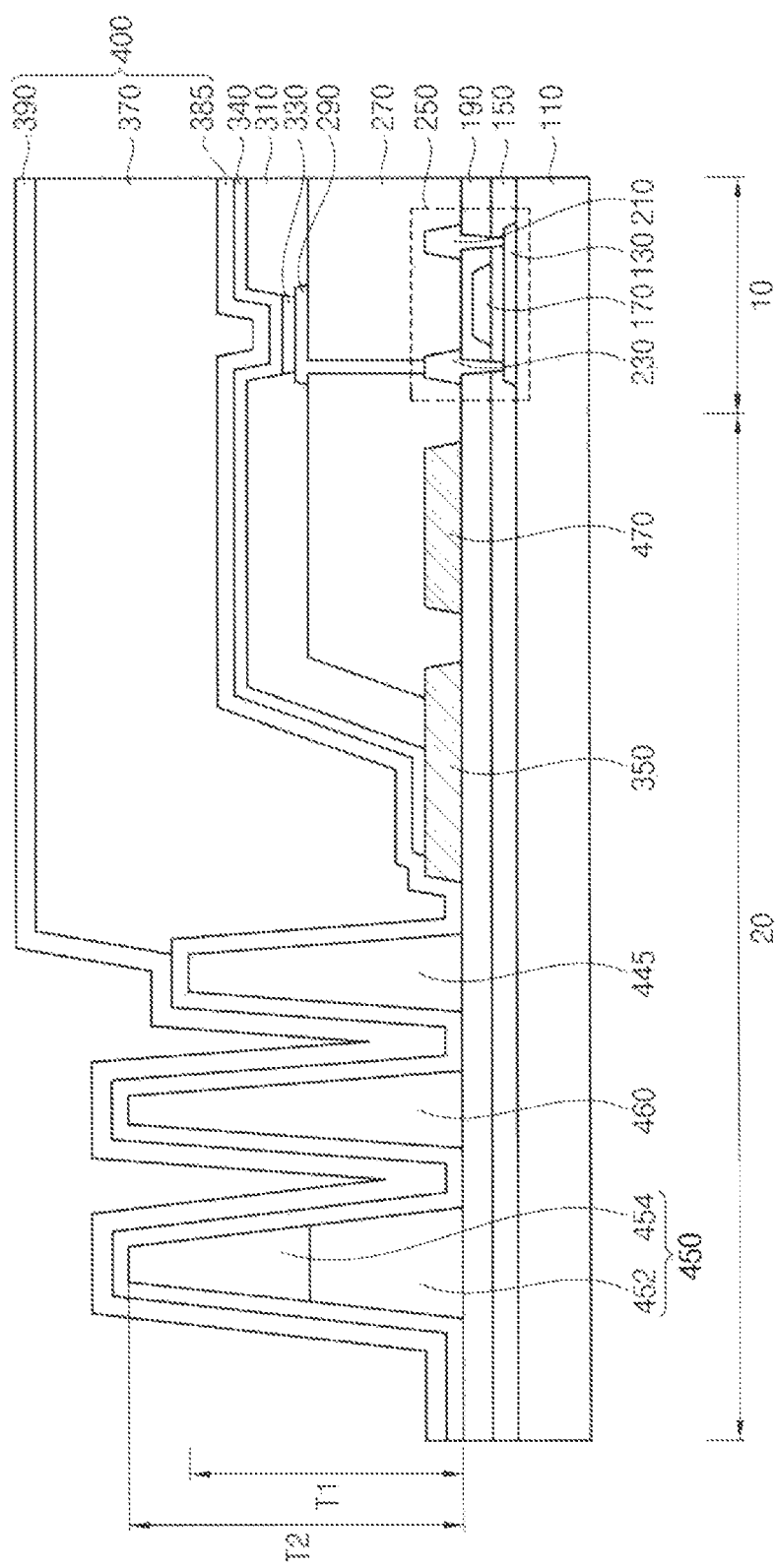
FIG. 23 is a cross-sectional view illustrating a display device in accordance with example embodiments.

FIG. 23 is a cross-sectional view illustrating a display device in accordance with example embodiments. A display device illustrated in FIG. 23 can have a configuration substantially the same as or similar to that of a display device 100 described with reference to FIG. 2 except a third block member 460. In FIG. 23, detailed descriptions for elements, which are substantially the same as or similar to the elements described with reference to FIG. 2, will be omitted.

Referring to FIG. 23, a display device includes a substrate 110, a semiconductor element 250, a gate insulation layer 150, an insulating interlayer 190, a planarization layer 270, a first power supply voltage line 350, a second power supply voltage line 470, a display structure, a pixel defining layer 310, first block member 445, a second block member 450, a third block member 460, a thin film encapsulation structure 400, etc. Here, the display structure can include a lower electrode 290, a light emitting layer 330, and an upper electrode 340, and the semiconductor element 250 can include an active layer 130, a gate electrode 170, a source electrode 210, and a drain electrode 230. The thin film encapsulation structure 400 can include a first encapsulation layer 385, a second encapsulation layer 370, and a third encapsulation layer 390. In addition, the second block member 450 can include a lower block pattern 452 and an upper block pattern 454.

The third block member 460 can be disposed in the peripheral region 20 on the insulating interlayer 190. In example embodiments, the third block member 460 is disposed between the first block member 445 and the second block member 450. In some embodiments, the third block member 460, the first block member 445, and the second block member 450 are spaced apart from each other. In addition, the third block member 460 can have a second height T2.

The first block member 445, the second block member 450, and the third block member 460 can be substantially simultaneously (or concurrently) formed using a half tone slit mask, and each of the second block member 450 and the third block member 460 can be formed in a light shielding region of the half tone slit mask. Accordingly, each of the second block member 450 and the third block member 460 can have the second height T2.

In example embodiments, as the display device includes the first block member 445, the second block member 450, and the third block member 460, leakage of the second encapsulation layer 370 can be relatively readily blocked, and can readily support a mask used in a process forming the display device.

Figure 24:
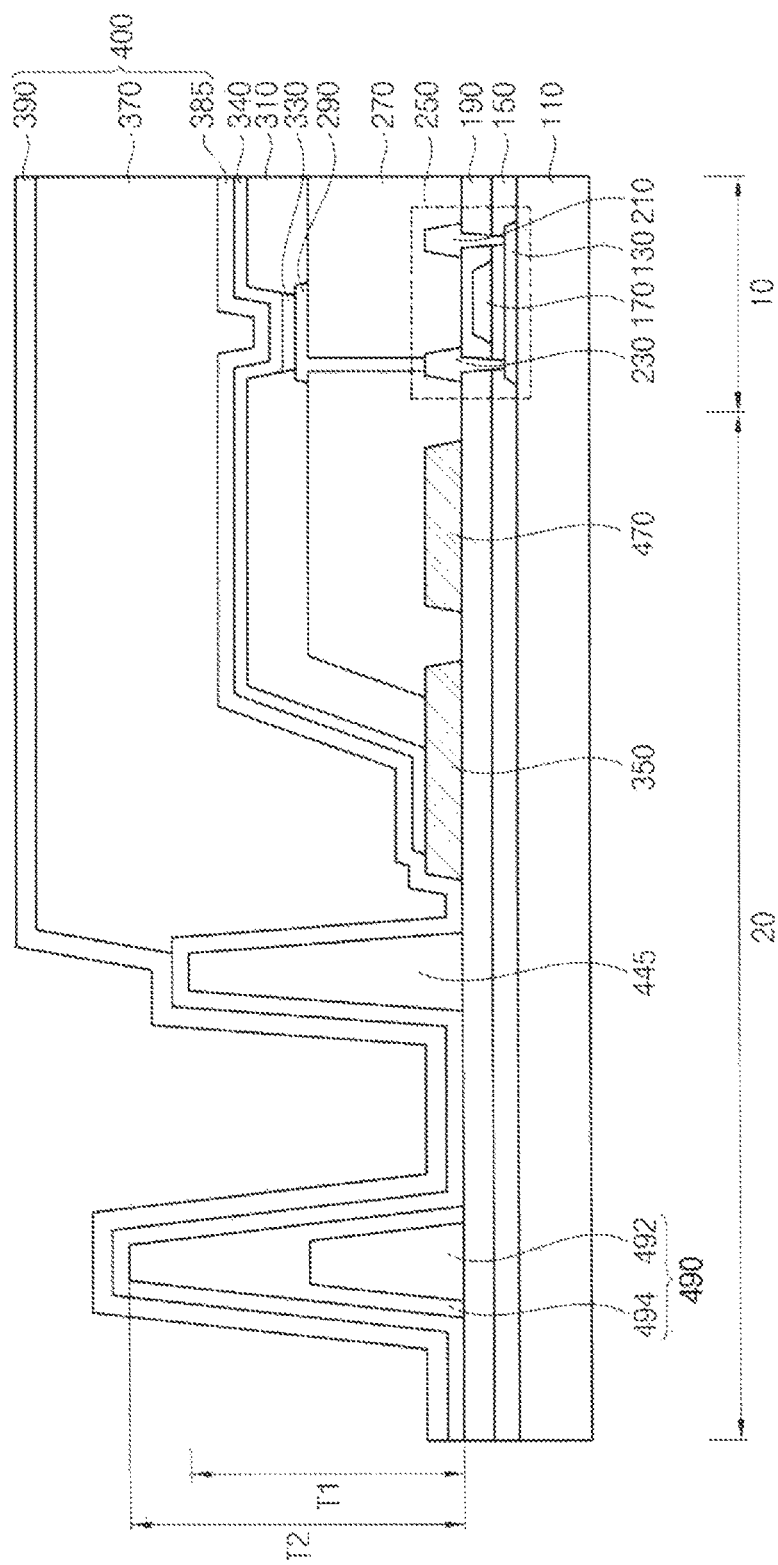
FIG. 24 is a cross-sectional view illustrating a display device in accordance with example embodiments.

FIG. 24 is a cross-sectional view illustrating a display device in accordance with example embodiments. A display device illustrated in FIG. 24 can have a configuration substantially the same as or similar to that of a display device 100 described with reference to FIG. 2 except a second block member 490. In FIG. 24, detailed descriptions for elements, which are substantially the same as or similar to the elements described with reference to FIG. 2, will be omitted.

Referring to FIG. 24, a display device includes a substrate 110, a semiconductor element 250, a gate insulation layer 150, an insulating interlayer 190, a planarization layer 270, a first power supply voltage line 350, a second power supply voltage line 470, a display structure, a pixel defining layer 310, first block member 445, a second block member 490, a thin film encapsulation structure 400, etc. Here, the display structure can include a lower electrode 290, a light emitting layer 330, and an upper electrode 340, and the semiconductor element 250 can include an active layer 130, a gate electrode 170, a source electrode 210, and a drain electrode 230. The thin film encapsulation structure 400 can include a first encapsulation layer 385, a second encapsulation layer 370, and a third encapsulation layer 390. In addition, the second block member 490 can include a lower block pattern 492 and an upper block pattern 494.

The first block pattern 445 can have a first height T1, and the first block member 445 and the pixel defining layer 310 can be substantially simultaneously (or concurrently) formed using the same materials.

The second block member 490 can include the lower block pattern 492 and the upper block pattern 494. The lower block pattern 492 and the planarization layer 270 can be substantially simultaneously (or concurrently) formed using the same materials. The upper block pattern 494 can cover the lower block pattern 492, and can have a second height T2. For example, a portion of a lower surface of the upper block pattern 494 can be in contact with the substrate 110, and the upper block pattern 494 does not expose the lower block pattern 492.

Figure 25:
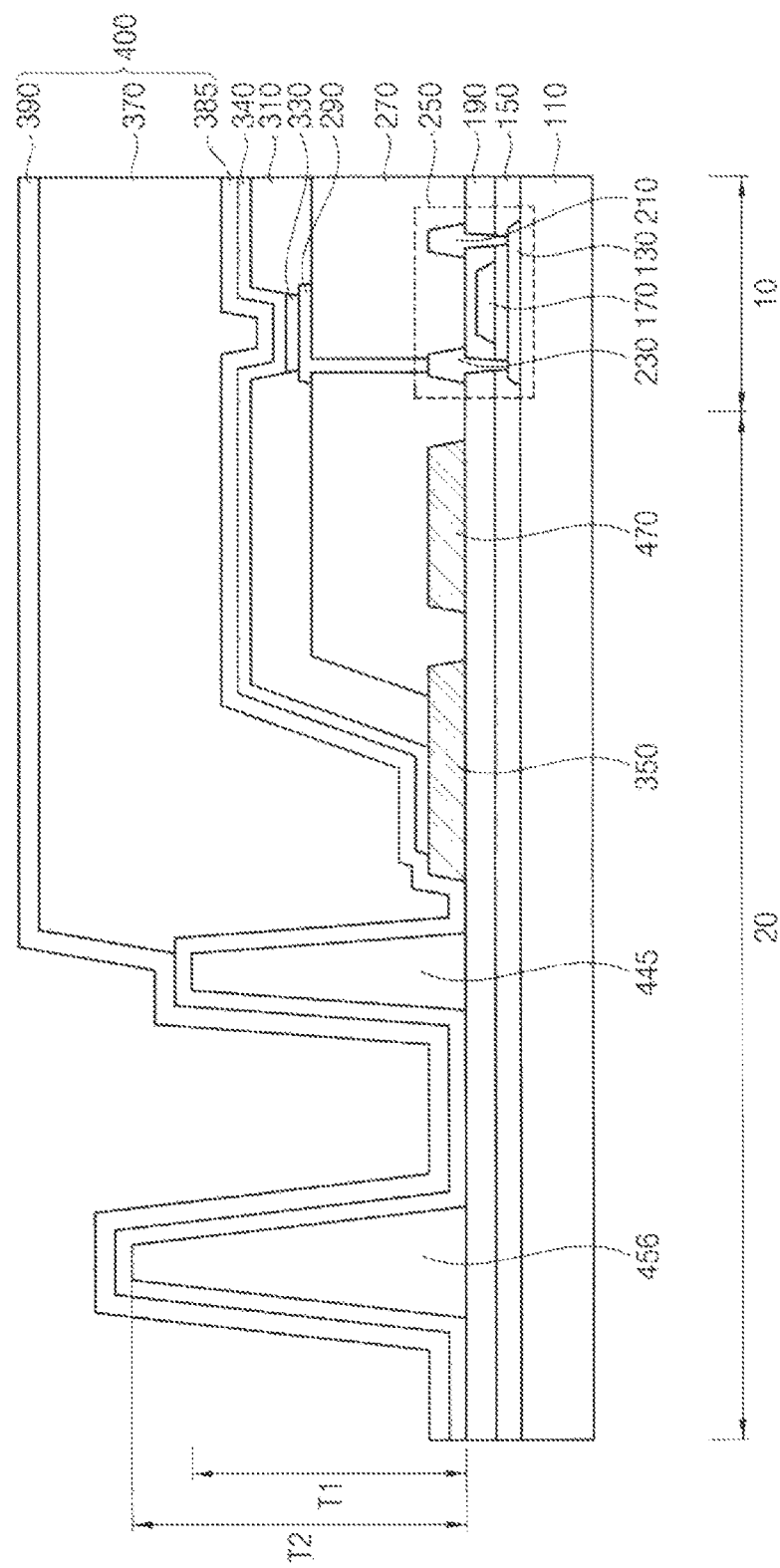
FIG. 25 is a cross-sectional view illustrating a display device in accordance with example embodiments.

FIG. 25 is a cross-sectional view illustrating a display device in accordance with example embodiments. A display device illustrated in FIG. 25 can have a configuration substantially the same as or similar to that of a display device 100 described with reference to FIG. 2 except a second block member 456. In FIG. 25, detailed descriptions for elements, which are substantially the same as or similar to the elements described with reference to FIG. 2, will be omitted.

Referring to FIG. 25, a display device includes a substrate 110, a semiconductor element 250, a gate insulation layer 150, an insulating interlayer 190, a planarization layer 270, a first power supply voltage line 350, a second power supply voltage line 470, a display structure, a pixel defining layer 310, first block member 445, a second block member 456, a thin film encapsulation structure 400, etc. Here, the display structure can include a lower electrode 290, a light emitting layer 330, and an upper electrode 340, and the semiconductor element 250 can include an active layer 130, a gate electrode 170, a source electrode 210, and a drain electrode 230. The thin film encapsulation structure 400 can include a first encapsulation layer 385, a second encapsulation layer 370, and a third encapsulation layer 390.

After a preliminary planarization layer is formed on the entire insulating interlayer 190, the planarization layer 270 can be formed in the display region 10 by partially removing the preliminary planarization layer.

After the planarization layer 270 is formed, a preliminary pixel defining layer can be disposed as a second height T2 on the entire insulating interlayer 190, and then the preliminary pixel defining layer can be partially removed using a half tone slit mask. The half tone slit mask can include an opening region, a light shielding region, a slit region, and a transflective region. The preliminary pixel defining layer can be completely removed in the opening region, and can be not removed in the light shielding region. In addition, the preliminary pixel defining layer can be partially removed in the transflective and slit regions. Here, compared to the slit region, the transflective region can further remove the preliminary pixel defining layer. That is, a first height T1 of the first block member 445 can be higher than a height of an upper surface of the pixel defining layer 310. The pixel defining layer 310 can be formed in the transflective region of the half tone slit mask, and the first block member 445 can be formed in the slit region of the half tone slit mask. In addition, the second block member 456 can be formed in the light shielding region of the half tone slit mask. A remaining portion except the pixel defining layer 310, the first block member 445, and the second block member 456 can be located in the opening region, and the preliminary pixel defining layer located in the opening region can be completely removed. In a process, an upper surface of the first block member 445 that is located under the slit region can be irregular. In example embodiments, as illustrated in FIG. 3, an upper surface of the first block member 445 can include a plurality of recesses. Alternatively, as illustrated in FIGS. 4 and 5, an upper surface of the first block member 445 can include a concave and convex structure. In addition, the second block member 456 can be integrally formed.

FIGS. 26 through 31 are cross-sectional views illustrating a method of manufacturing a display device in accordance with example embodiments. A method of manufacturing a display device illustrated in FIGS. 26 through 31 can have a configuration substantially the same as or similar to that of a method of manufacturing a display device described with reference to FIGS. 6 through 19 except a second block member 855. In FIGS. 26 through 31, detailed descriptions for elements, which are substantially the same as or similar to the elements described with reference to FIGS. 6 through 19, will be omitted.

Figure 26:
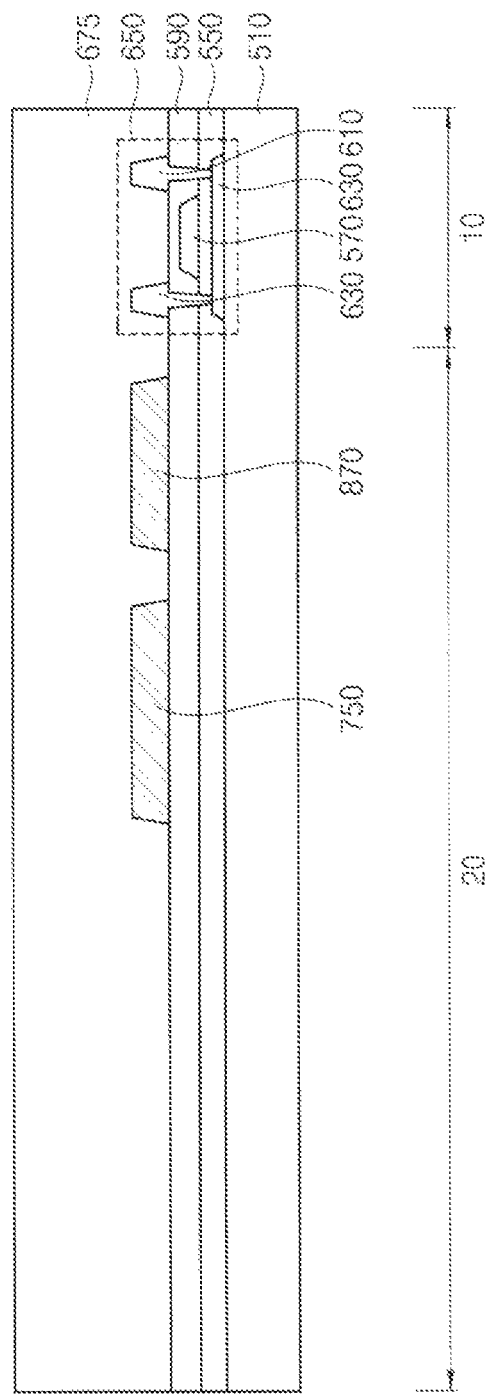
FIGS. 26, 27, 28, 29, 30 and 31 are cross-sectional views illustrating a method of manufacturing a display device in accordance with example embodiments.

Referring to FIG. 26, a preliminary planarization layer 675 is formed on the insulating interlayer 590. The preliminary planarization layer 675 can cover the first and second power supply voltage lines 750 and 870 and the source and drain electrodes 610 and 630, and can be formed on the entire insulating interlayer 590. The preliminary planarization layer 675 can be formed as a high thickness to sufficiently cover the first and second power supply voltage lines 750 and 870 and the source and drain electrodes 610 and 630. In this case, the preliminary planarization layer 675 can have a substantially flat upper surface, and a planarization process can be further performed on the preliminary planarization layer 675 to implement the flat upper surface of the preliminary planarization layer 675. The preliminary planarization layer 675 can be formed of organic materials or inorganic materials. In example embodiments, the preliminary planarization layer 675 is formed using organic materials.

Figure 27:
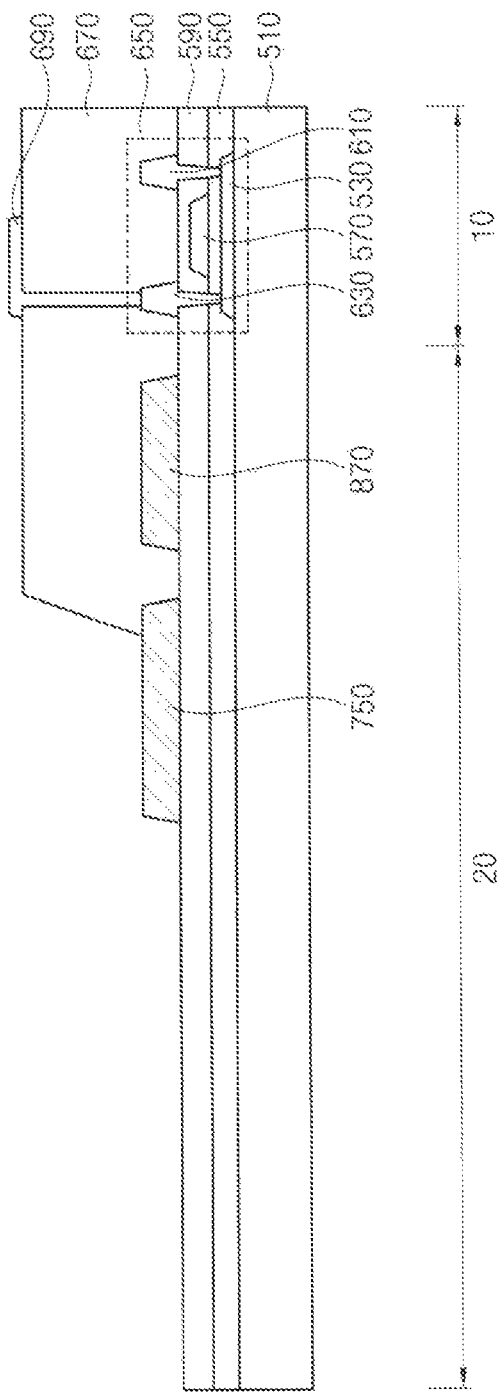

Referring to FIG. 27, a planarization layer 670 in the display region 10 is formed by partially removing the preliminary planarization layer 675. The planarization layer 670 can be formed on the source electrode 610, the drain electrode 630, the second power supply voltage line 870, and a portion of the first power supply voltage line 750.

A lower electrode 690 can be formed in the display region 10 on the planarization layer 670. The lower electrode 690 can be in contact with the drain electrode 630 via a contact hole formed by removing a portion of the planarization layer 670. In addition, the lower electrode 690 can be electrically connected to the semiconductor element 650. The lower electrode 690 can be formed using a metal, a metal alloy, metal nitride, conductive metal oxide, transparent conductive materials, etc. These can be used alone or in a suitable combination thereof.

Figure 28:
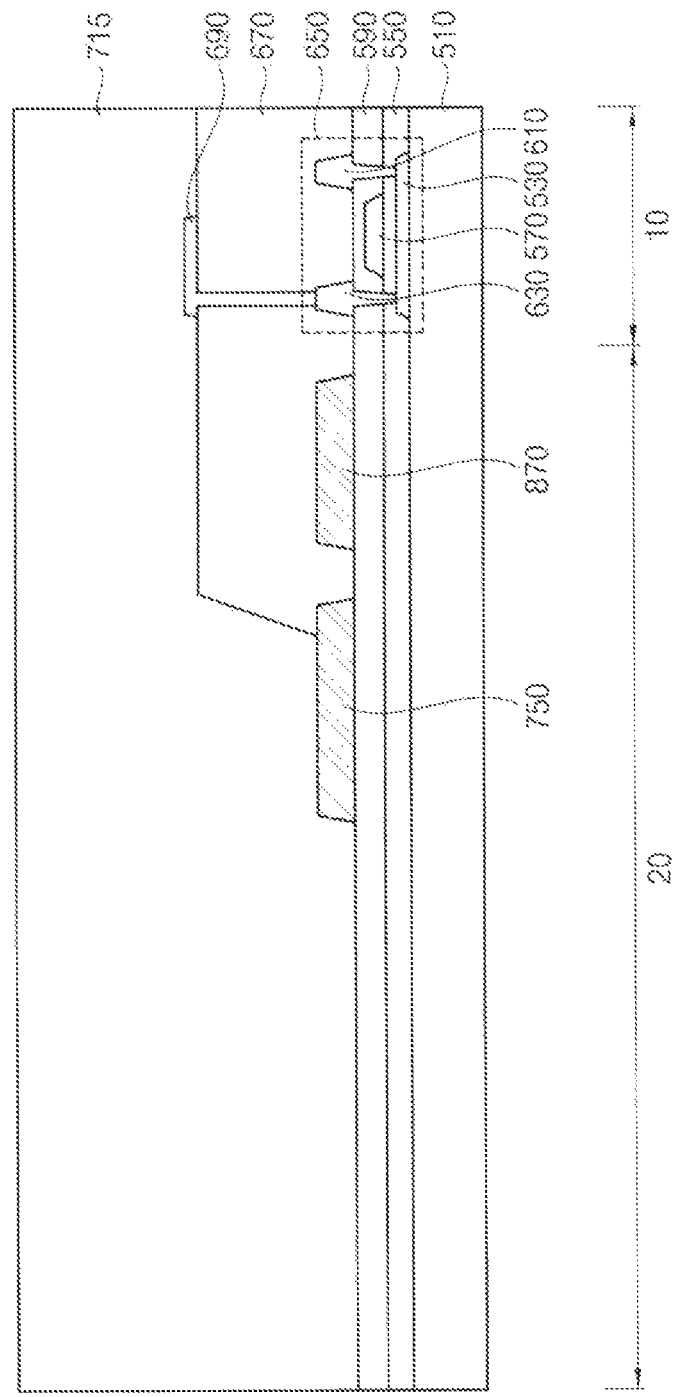

Referring to FIG. 28, a preliminary pixel defining layer 715 is formed on the insulating interlayer 590. The preliminary pixel defining layer 715 can be entirely formed on the first power supply voltage line 750, the planarization layer 670, and the lower electrode 690. The preliminary pixel defining layer 715 can be formed as a relatively high thickness to cover the first power supply voltage line 750, the planarization layer 670, and the lower electrode 690. The preliminary pixel defining layer 715 can be formed of organic materials or inorganic materials. In example embodiments, the preliminary pixel defining layer 715 is formed using organic materials.

Figure 29:
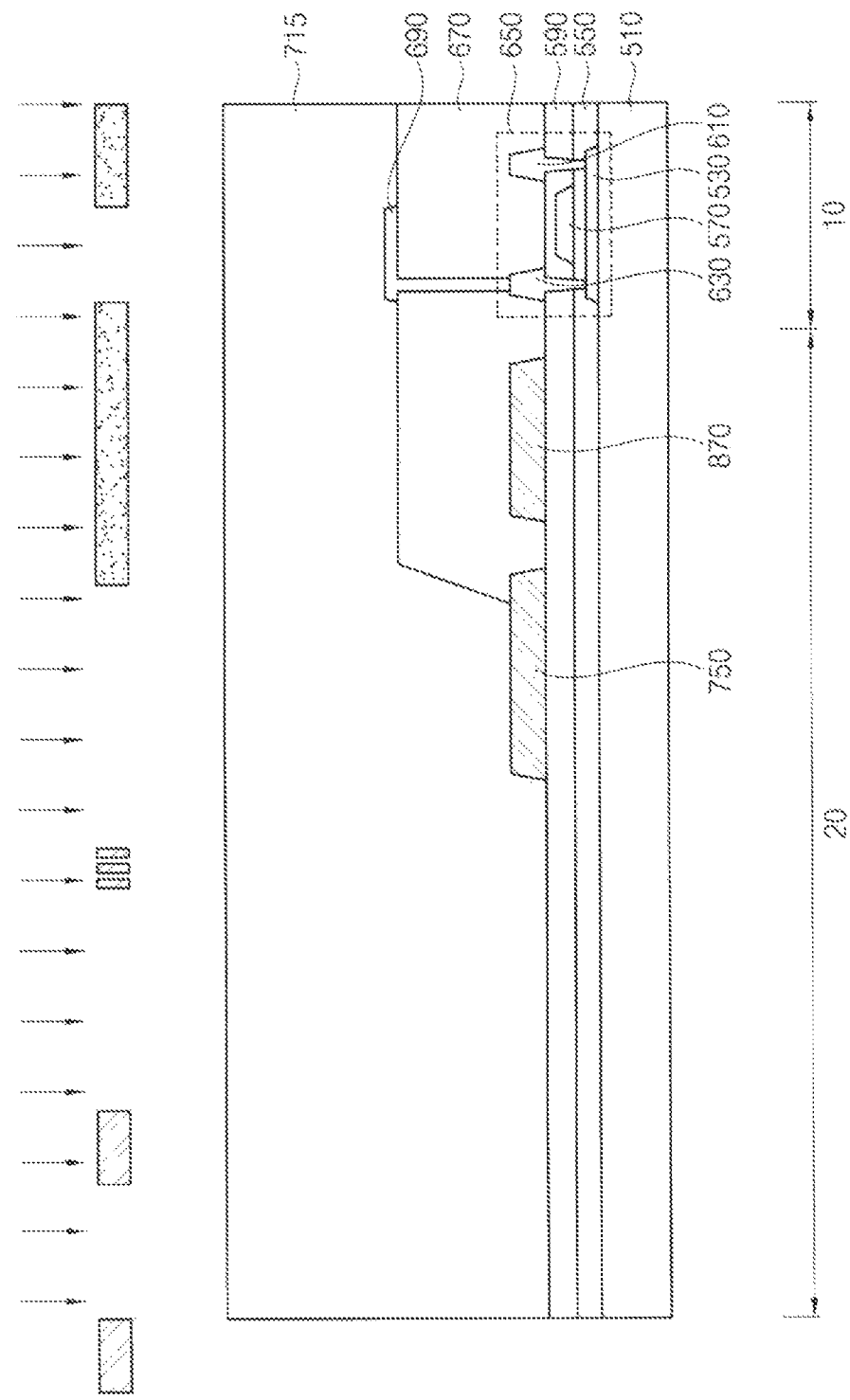

Referring FIG. 29, the preliminary pixel defining layer 715 is partially removed using a half tone slit mask. The half tone slit mask can be located on the preliminary pixel defining layer 715, and a light (e.g., ultra violet ray) can be irradiated in the preliminary pixel defining layer 715 through half tone slit mask 910.

Figure 30:
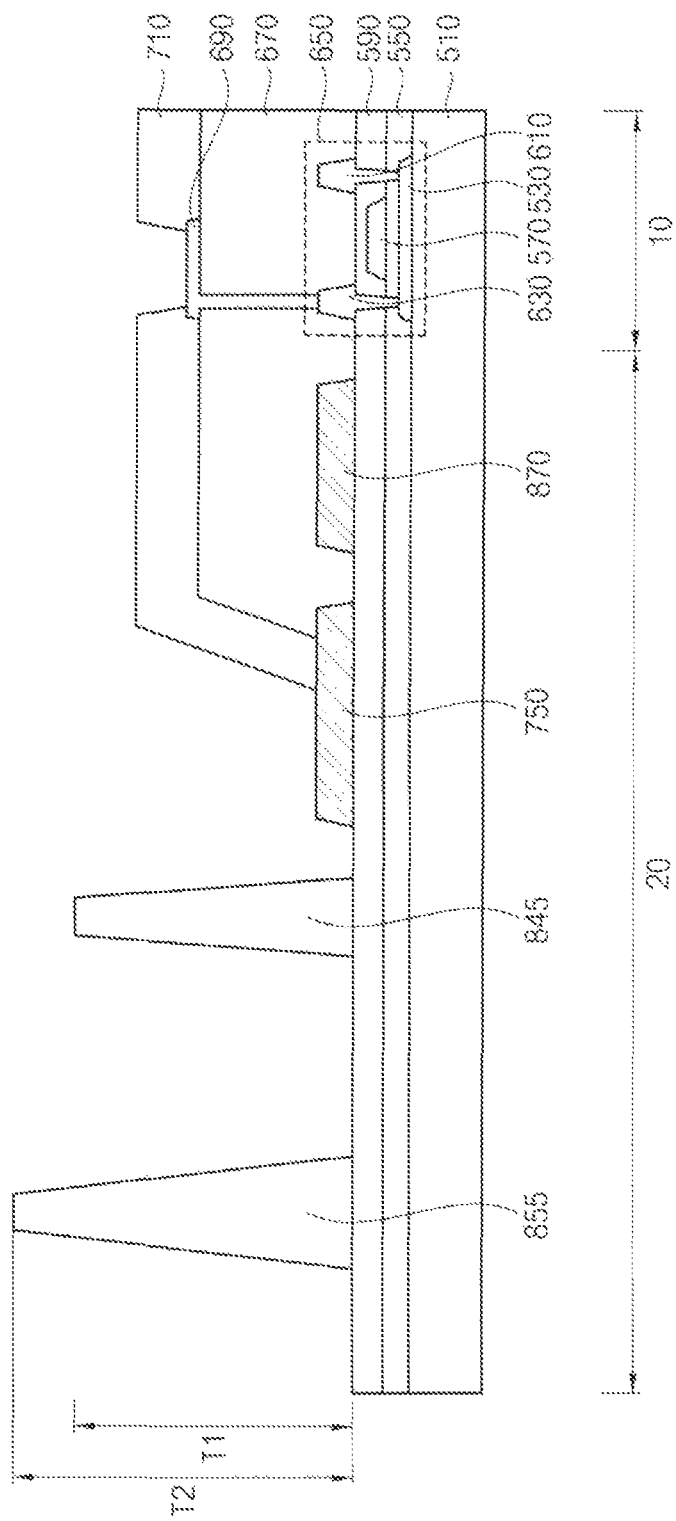

Referring to FIG. 30, a pixel defining layer 710 in a transflective region of the half tone slit mask, a first block member 845 in a slit region of the half tone slit mask, and a second block member 855 in the light shielding region of the half tone slit mask are formed by partially removing the preliminary pixel defining layer 715. Here, the preliminary pixel defining layer 715 can be completely removed in the opening region of the half tone slit mask.

That is, a second block member 855 can be formed as a second height T2, and the first block member 845 can be formed as a first height T1. Here, the first height T1 of the first block member 845 can be higher than a level of an upper surface of the pixel defining layer 710.

In this process, an upper surface of the first block member 845 that is located under the slit region can be irregular (e.g., uneven). An upper surface of the first block member 845 can include a plurality of recesses (refer to FIG. 3). Alternatively, an upper surface of the first block member 845 can include a concave and convex structure (refer to FIGS. 4 and 5). Each of the first block member 845 and the second block member 855 can be formed of organic materials. For example, each of the first block member 845 and the second block member 855 can be formed using a polyimide-based resin, a photoresist, an acryl-based resin, a polyamide-based resin, a siloxane-based resin, etc.

Figure 31:
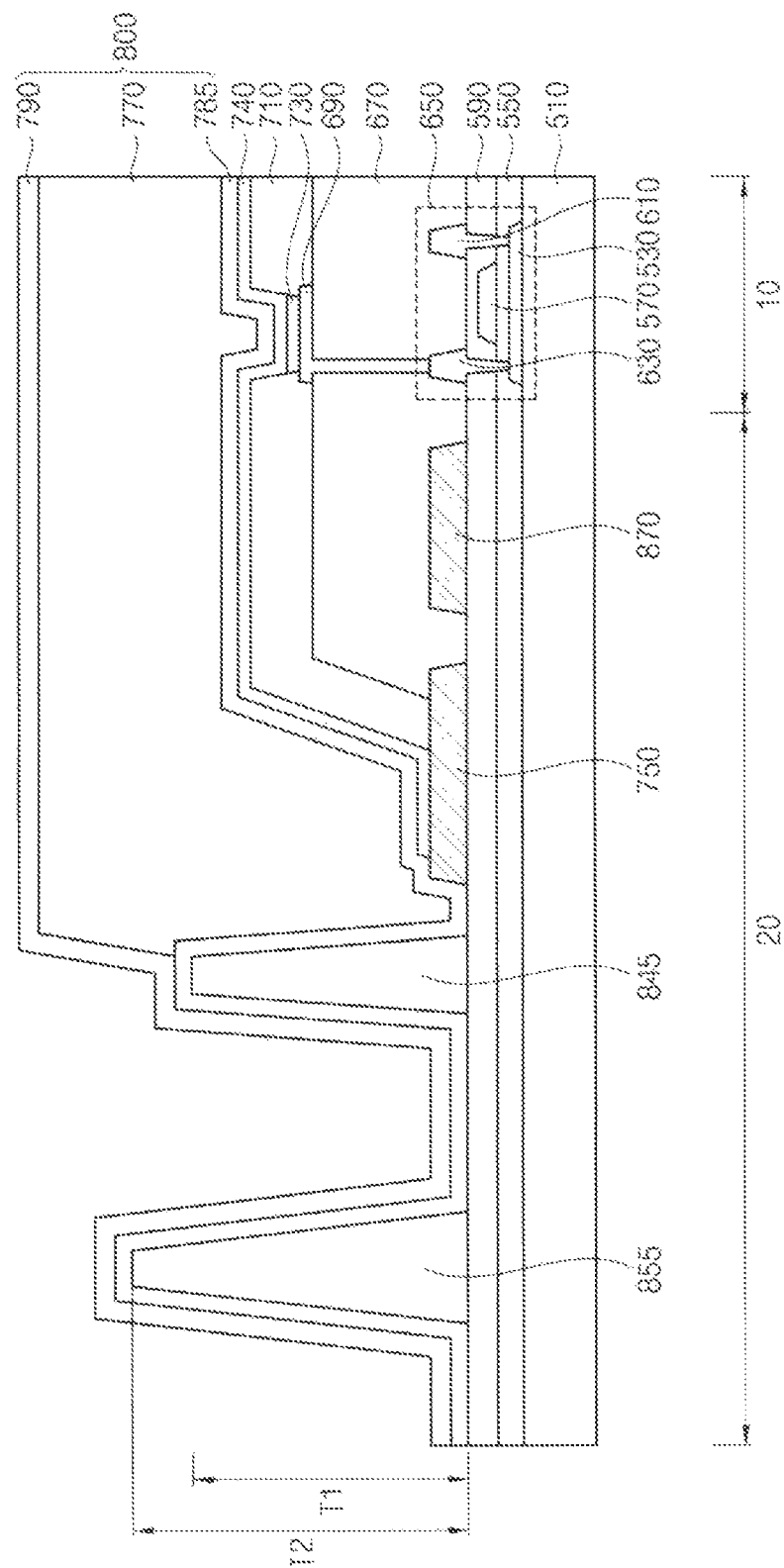

Referring to FIG. 31, a light emitting layer 730 is formed on a portion where at least a portion of the lower electrode 690 is exposed. The light emitting layer 730 can be formed using at least one of light emitting materials that can generate different colors of light (e.g., a red color of light, a blue color of light, and a green color of light, etc.) according to sub-pixels. Alternatively, the light emitting layer 730 can generally generate a white color of light by stacking a plurality of light emitting materials that can generate different colors of light such as a red color of light, a green color of light, a blue color of light, etc.

An upper electrode 740 can be formed on the pixel defining layer 710, the light emitting layer 730, and a portion of the first power supply voltage line 750. The upper electrode 740 can be formed using a metal, a metal alloy, metal nitride, conductive metal oxide, transparent conductive materials, etc. Accordingly, a display structure including the lower electrode 690, the light emitting layer 730, and the upper electrode 740 can be formed.

A thin film encapsulation structure 800 can be formed on the upper electrode 740, the first power supply voltage line 750, the first block member 845, and the second block member 855. The thin film encapsulation structure 800 can include the first encapsulation layer 785, the second encapsulation layer 770, and the third encapsulation layer 790. For example, the second encapsulation layer 770 is formed on the first encapsulation layer 785, and the third encapsulation layer 790 is disposed on the second encapsulation layer 770. The first encapsulation layer 785 can be disposed on the upper electrode 740, the first power supply voltage line 750, the first block member 845, and the second block member 855. The first encapsulation layer 785 can cover the upper electrode 740, the first power supply voltage line 750, the first block member 845, and the second block member 855, and can be formed having a substantially uniform thickness along a profile of the upper electrode 740, the first power supply voltage line 750, the first block member 845, and the second block member 855. The first encapsulation layer 785 can prevent the display structure from being deteriorated by the permeation of moisture, water, oxygen, etc. In addition, the first encapsulation layer 785 can protect the display structure from external impacts. The first encapsulation layer 785 can be formed using inorganic materials.

The second encapsulation layer 770 can be formed in the display region 10 and a portion of the peripheral region 20 on the first encapsulation layer 785. The second encapsulation layer 770 can improve the flatness of a display device, and can protect the display structure disposed in the display region 10. The second encapsulation layer 770 can be formed using organic materials. In example embodiments, the second encapsulation layer 770 overlaps at least a portion of the first block member 845.

The third encapsulation layer 790 can be formed on the first encapsulation layer 785 formed in the peripheral region 20 and the second encapsulation layer 770. The third encapsulation layer 790 can cover the first encapsulation layer 785 formed in the peripheral region 20 and the second encapsulation layer 770, and can be disposed having a substantially uniform thickness along a profile of the first encapsulation layer 785 formed in the peripheral region 20 and the second encapsulation layer 770. The third encapsulation layer 790 together with the first encapsulation layer 785 and the second encapsulation layer 770 can prevent the display structure from being deteriorated by the permeation of moisture, water, oxygen, etc. In addition, the third encapsulation layer 790 together with the first encapsulation layer 785 and the second encapsulation layer 770 can protect the display structure from external impacts. The third encapsulation layer 790 can be formed of inorganic materials. In example embodiments, the first encapsulation layer 785 and the third encapsulation layer 790 contact each other on the second block member 855. Accordingly, the display device illustrated in FIG. 25 can be manufactured.

The described technology can be applied to various display devices including a display device. For example, the described technology can be applied to a display device for a vehicle, a ship, an aircraft, portable communication devices, information transfer, a medical device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive technology. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
   a substrate including a display region and a peripheral region surrounding the display region;
   an insulation layer on the substrate, the insulation layer being formed of an inorganic material;
   a plurality of display structures in the display region;
   a first block member in the peripheral region and surrounding the display structures, the first block member having a first height;
   a second block member spaced apart from the first block member in a first direction extending from the display region to the peripheral region, the second block member surrounding the first block member, the second block member having a second height that is greater than the first height;
   a first encapsulation layer over the display structures, the first block member, and the second block member, wherein the first encapsulation layer is formed of an inorganic material;
   a second encapsulation layer over the first encapsulation layer, the second encapsulation layer being formed of an organic material; and
   a third encapsulation layer over the first and second encapsulation layers, the third encapsulation layer formed of an inorganic material,
   wherein at least one of the first and second block members is in direct contact with the insulation layer.

2. The display device of claim 1, wherein the second encapsulation layer overlaps at least a portion of the first block member.

3. The display device of claim 2, wherein the second encapsulation layer and the first block member are overlapped in the depth dimension of the display device.

4. The display device of claim 1, wherein the first and second block members are formed of a same material, and wherein an upper surface of the first block member is uneven.

5. The display device of claim 1, wherein the first and third encapsulation layers directly contact each other over the second block member.

6. The display device of claim 1, wherein the first block member does not directly contact the second block member, and wherein the first and second block members are parallel to each other.

7. The display device of claim 1, further comprising: a third block member in the peripheral region on the substrate, wherein the third block member is spaced apart from the first block member in a second direction extending from the peripheral region to the display region, and wherein the third block member has the first height.

8. The display device of claim 7, wherein the first, second, and third block members are formed of a same material, and wherein an upper surface of each of the first to third block members is uneven.

9. The display device of claim 1, further comprising a plurality of semiconductor elements interposed between the substrate and the display structures, wherein each of the semiconductor elements includes:
   an active layer over the substrate;
   a gate electrode over the active layer; and
   source and drain electrodes over the gate electrode.

10. The display device of claim 9, further comprising:
    a gate insulation layer over the active layer;
    an insulating interlayer over the gate electrode;
    a planarization layer over the source and drain electrodes; and
    a pixel defining layer over the planarization layer.

11. The display device of claim 10, wherein the second block member includes:
    a lower block pattern over the insulating interlayer; and
    an upper block pattern over the lower block pattern.

12. The display device of claim 11, wherein the upper block pattern covers the lower block pattern and has the second height, wherein a portion of a lower surface of the upper block pattern directly contacts the substrate, and wherein the upper block pattern does not expose the lower block pattern.

13. The display device of claim 12, wherein the lower block pattern and the planarization layer are formed of a same material.

14. The display device of claim 11, wherein the first height is greater than a height defined from an upper surface of the substrate to an upper surface of the pixel defining layer.

15. The display device of claim 11, wherein each of the display structures includes:
    a lower electrode interposed between the planarization layer and the pixel defining layer, the lower electrode having a plurality of side portions directly contacting the pixel defining layer;
    a light emitting layer over the lower electrode; and
    an upper electrode over the light emitting layer.

16. The display device of claim 15, further comprising:
    a first power supply voltage line in the peripheral region and over the insulating interlayer, the first power supply voltage line being spaced apart from the first block member in a second direction extending from the peripheral region to the display region; and a second power supply voltage line spaced apart from the first power supply voltage line in the second direction, wherein the first block member is disposed over the first power supply voltage line.

17. The display device of claim 16, wherein the upper electrode extends in the second direction and directly contacts the first power supply voltage line in the peripheral region.

18. The display device of claim 17, wherein the first power supply voltage line is configured to receive a first power supply voltage, and wherein the second power supply voltage line is configured to receive a second power supply voltage that is greater than the first power supply voltage.

19. The display device of claim 16, wherein the first and second power supply voltage lines and the source and drain electrodes are formed of a same material.

20. The display device of claim 1, wherein the first encapsulation layer is in direct contact with the insulation layer.

21. The display device of claim 20, wherein a portion where the first encapsulation layer is in direct contact with the insulation layer is located between the first block member and the second block member, inside the first block member, and outside the second block member.

22. A display device, comprising:
a substrate including a display region and a peripheral region surrounding the display region;
an insulation layer on the substrate, the insulation layer being formed of an inorganic material;
a plurality of display structures in the display region;
a first block member in the peripheral region and surrounding the display structures, the first block member having a first height;
a second block member spaced apart from the first block member in a first direction extending from the display region to the peripheral region, the second block member surrounding the first block member, the second block member having a second height that is greater than the first height;
a first encapsulation layer over the display structures, the first block member, and the second block member, wherein the first encapsulation layer is formed of an inorganic material;
a second encapsulation layer over the first encapsulation layer, the second encapsulation layer being disposed on at least a portion of the first block member, the second encapsulation layer being formed of an organic material; and
a third encapsulation layer over the first and second encapsulation layers, the third encapsulation layer being formed of an inorganic material,
wherein at least one of the first and second block members is in direct contact with the insulation layer.

* * * * *